US010354725B2

(12) United States Patent
Nagai

(10) Patent No.: US 10,354,725 B2
(45) Date of Patent: Jul. 16, 2019

(54) METHOD FOR REWRITING SEMICONDUCTOR STORAGE DEVICE AND THE SEMICONDUCTOR STORAGE DEVICE

(71) Applicant: Panasonic Intellectual Property Management Co., Ltd., Osaka (JP)

(72) Inventor: Hiroyasu Nagai, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/688,161

(22) Filed: Aug. 28, 2017

(65) Prior Publication Data

US 2017/0358349 A1 Dec. 14, 2017

Related U.S. Application Data

(63) Continuation of application No. PCT/JP2016/001123, filed on Mar. 2, 2016.

(30) Foreign Application Priority Data

Mar. 27, 2015 (JP) ................................ 2015-067676

(51) Int. Cl.
  *G11C 13/00* (2006.01)
(52) U.S. Cl.
  CPC ...... *G11C 13/0026* (2013.01); *G11C 13/0028* (2013.01); *G11C 13/0061* (2013.01);
  (Continued)
(58) Field of Classification Search
  CPC .................... G11C 13/0026; G11C 13/0028
  See application file for complete search history.

(56) References Cited

U.S. PATENT DOCUMENTS

| 6,549,455 B2* | 4/2003 | Yamada | .............. G11C 11/16 257/E27.005 |
| 6,760,244 B2* | 7/2004 | Yamada | .............. G11C 11/16 365/171 |

(Continued)

FOREIGN PATENT DOCUMENTS

| JP | 2007-184063 | 7/2007 |
| JP | 2011-204358 | 10/2011 |

(Continued)

OTHER PUBLICATIONS

International Search Report dated Apr. 12, 2016 in corresponding International Application No. PCT/JP2016/001123.

*Primary Examiner* — Tri M Hoang
(74) *Attorney, Agent, or Firm* — Wenderoth, Lind & Ponack, L.L.P.

(57) ABSTRACT

A method for rewriting a semiconductor storage device includes: a first rewriting step of applying a pre-charge voltage to both of a plurality of bit lines and a plurality of source lines; a second rewriting step of applying a rewrite voltage to one of a selected bit line or a selected source line; a third rewriting step of applying a rewrite voltage to both of the selected bit line and the selected source line; a fourth rewriting step of applying a pre-charge voltage to one of the selected bit line or the selected source line; and a fifth rewriting step of applying a pre-charge voltage to both of the selected bit line and the selected source line.

5 Claims, 18 Drawing Sheets

(52) U.S. Cl.
CPC .. *G11C 13/0069* (2013.01); *G11C 2013/0071* (2013.01); *G11C 2213/79* (2013.01); *G11C 2213/82* (2013.01)

(56) References Cited

U.S. PATENT DOCUMENTS

| | | | |
|---|---|---|---|
| 7,414,909 B2* | 8/2008 | Okamoto | G11C 17/12 365/104 |
| 7,835,171 B2* | 11/2010 | Ono | G11C 13/0011 365/148 |
| 2007/0159870 A1 | 7/2007 | Tanizaki et al. | |
| 2011/0292715 A1 | 12/2011 | Ishihara | |
| 2014/0056055 A1 | 2/2014 | Ikeda et al. | |
| 2016/0064095 A1* | 3/2016 | Kato | G11C 16/28 365/185.21 |

FOREIGN PATENT DOCUMENTS

| | | |
|---|---|---|
| JP | 2011-248953 | 12/2011 |
| WO | 2013/076935 | 5/2013 |

* cited by examiner

METHOD FOR REWRITING SEMICONDUCTOR STORAGE DEVICE AND THE SEMICONDUCTOR STORAGE DEVICE

CROSS REFERENCE TO RELATED APPLICATIONS

This application is a U.S. continuation application of PCT International Patent Application Number PCT/JP2016/001123 filed on Mar. 2, 2016, claiming the benefit of priority of Japanese Patent Application Number 2015-067676 filed on Mar. 27, 2015, the entire contents of which are hereby incorporated by reference.

BACKGROUND

1. Technical Field

The present disclosure relates to a method for rewriting a semiconductor storage device and the semiconductor storage device.

2. Description of the Related Art

Semiconductor storage devices are used for embedded devices, computers, information communication devices etc. Recent years have seen active technical' development, for semiconductor storage devices, such as increase in capacity, size reduction, high-speed rewriting, high-speed reading, saving in power consumption for operation.

In particular, a resistive memory (resistive random access memory (ReRAM)) in which a variable resistance element is used as a storage element is characterized by being able to be rewritten at higher speed and using a lower power consumption than a conventional flash memory.

The variable resistance element is an element which has a property that a resistance value reversibly changes due to an electrical signal, and is capable of storing data corresponding to the reversibly variable resistance value of the variable resistance element.

A semiconductor storage device which is generally known as a semiconductor storage device with a variable resistance element is a semiconductor storage device which includes a matrix of what is called 1T1R memory cells in each of which a metal oxide semiconductor (MOS) transistor and a variable resistance element are connected in series at an intersection point between a word line and a bit line which intersect at a right angle.

Refinement of semiconductor storage devices reduces the sizes of MOS transistors included therein, and reduces the thicknesses of oxide films of the MOS transistors. This affects properties such as time dependent dielectric breakdown (TDDB), hot carrier injection (HCI), etc. This makes it difficult to apply a high voltage to the MOS transistors. For example, it becomes difficult to apply a bias voltage of 3 V to a MOS transistor in a 1.1 V system.

In view of this, Patent Literature (PTL) 1 (Japanese Unexamined Patent Application Publication No. 2011-248953) discloses a method for applying a high voltage to MOS transistors. More specifically, a pre-charge voltage is applied to the drains and sources of the MOS transistors. This significantly reduces a bias voltage to be applied to the gates of the MOS transistors, and thus functions as an effective countermeasure against the problem caused by the refinement of the semiconductor storage devices.

SUMMARY

However, for example, in a simultaneous pulse method which is a method for applying write voltages simultaneously in a state where a pre-charge voltage is applied to the drains and sources of MOS transistors, the timings for applying the write voltages may deviate due to wiring delay etc. In this way, in the simultaneous pulse method, the waveforms of pulses applied to change the resistance values of variable resistance elements are unstable. A plurality of application pulses each having such an unstable waveform (hereinafter referred to as an unstable-waveform application pulse) are generated, which increases variation in the widths of the application pulses.

In view of the above problems, the present disclosure provides a method for rewriting a semiconductor storage device capable of reducing occurrence of a plurality of unstable-waveform application pulses and variation in the widths of the application pulses when timings for applying the write voltages have deviated due to wiring delay etc., and also provides the semiconductor device.

A method for rewriting a semiconductor storage device according to an aspect of the present disclosure is a method for rewriting a semiconductor storage device including a memory cell array, a plurality of word lines, a plurality of bit lines, and a plurality of source lines, the method including: when at least one word line is selected from among the plurality of word lines as a selected word line, at least one bit line is selected from among the plurality of bit lines as a selected bit line, and at least one source line is selected from among the plurality of source lines as a selected source line, a first rewriting step of applying a pre-charge voltage to both of the plurality of bit lines and the plurality of source lines; a second rewriting step of applying a rewrite voltage to one of the selected bit line or the selected source line; a third rewriting step of applying a rewrite voltage to both of the selected bit line and the selected source line; a fourth rewriting step of applying a pre-charge voltage to one of the selected bit line or the selected source line; and a fifth rewriting step of applying a pre-charge voltage to both of the selected bit line and the selected source line.

A method for rewriting a semiconductor storage device according to another aspect of the present disclosure is a method for rewriting a semiconductor storage device including a memory cell array, a plurality of word lines, a plurality of bit lines, and a plurality of source lines, the method including: when at least one word line is selected from among the plurality of word lines as a selected word line, at least one bit line is selected from among the plurality of bit lines as a selected bit line, and at least one source line is selected from among the plurality of source lines as a selected source line, a first rewriting step of applying a pre-charge voltage to both of the plurality of bit lines and the plurality of source lines; a second rewriting step of grounding both of the selected bit line and the selected source line; a third rewriting step of applying a rewrite voltage to both of the selected bit line and the selected source line; a fourth rewriting step of grounding both of the selected bit line and the selected source line; and a fifth rewriting step of applying a pre-charge voltage to both of the selected bit line and the selected source line.

A method for rewriting a semiconductor storage device according to another aspect of the present disclosure is a method for rewriting a semiconductor storage device including a memory cell array, a plurality of word lines, a plurality of bit lines, and a plurality of source lines, the method including: when at least one word line is selected from among the plurality of word lines as a selected word line, at least one bit line is selected from among the plurality of bit lines as a selected bit line, and at least one source line is selected from among the plurality of source lines as a selected source line, a first rewriting step of applying a pre-charge voltage to both of the plurality of bit lines and the plurality of source lines; a second rewriting step of grounding one of the selected bit line or the selected source line; a third rewriting step of grounding both of the selected bit line and the selected source line; a fourth rewriting step of applying a rewrite voltage to both of the selected bit line and the selected source line; a fifth rewriting step of grounding both of the selected bit line and the selected source line; a sixth rewriting step of applying a pre-charge voltage to one of the selected bit line or the selected source line; and a seventh rewriting step of applying a pre-charge voltage to both of the selected bit line and the selected source line.

A method for rewriting a semiconductor storage device according to another aspect of the present disclosure is a method for rewriting a semiconductor storage device including a memory cell array, a plurality of word lines, a plurality of bit lines, and a plurality of source lines, the method including: when at least one word line is selected from among the plurality of word lines as a selected word line, at least one bit line is selected from among the plurality of bit lines as a selected bit line, and at least one source line is selected from among the plurality of source lines as a selected source line, a first rewriting step of applying a pre-charge voltage to the selected word line; a second rewriting step of applying a rewrite voltage to the selected word line; and a third rewriting step of applying a pre-charge voltage to the selected word line.

A semiconductor storage device according to an aspect of the present disclosure is a semiconductor storage device including: a memory cell array; a plurality of word lines arranged to extend in a first direction; a plurality of bit lines arranged to extend in a second direction different from the first direction; a plurality of source lines arranged to extend in the second direction; a first decoder circuit which selects at least one word line from among the plurality of word lines as a selected word line; a second decoder circuit which selects at least one bit line from among the plurality of bit lines as a selected bit line, and selects at least one source line from among the plurality of source lines as a selected source line; a power supply circuit which generates at least two voltages which are a rewrite voltage and a pre-charge voltage; a control circuit which generates: a clock signal and a pulse signal for applying the rewrite voltage to the memory cell array; a word line selection signal for selecting the selected word line; a bit line selection signal for selecting the selected bit line; a source line selection signal for selecting the selected source line; and a pre-charge enable signal for applying the pre-charge voltage to the plurality of bit lines and the plurality of source lines; and a pulse generator circuit which generates: a word-line pulse enable signal for controlling application of a pulse to the selected word line; a bit-line pulse enable signal and a bit-line discharge enable signal for controlling application of a pulse to the selected bit line; and a source-line pulse enable signal and a source-line discharge enable signal for controlling application of a pulse to the selected source line, wherein the memory cell array includes a plurality of memory cells, the plurality of memory cells each include a control element and a storage element, the control element and the storage element are connected to each other, the control element is connected to a word line included in the plurality of word lines, and to a source line included in the plurality of source lines, the storage element is connected to a bit line included in the plurality of bit lines, the plurality of word lines are connected to the first decoder circuit, the plurality of bit lines and the plurality of source lines are connected to the second decoder circuit, the word-line selection signal is input to the first decoder circuit, the bit-line selection signal, the source-line selection signal, and the pre-charge enable signal are input to the second decoder circuit, the clock signal and the pulse signal are input to the pulse generator circuit, the word-line pulse enable signal is input to the first decoder circuit, the bit-line pulse enable signal, the bit-line discharge enable signal, the source-line pulse enable signal, and the source-line discharge enable signal are input to the second decoder circuit, and the rewrite voltage and the pre-charge voltage are applied to the first decoder circuit or the second decoder circuit.

A semiconductor storage device according to another aspect of the present disclosure is a semiconductor storage device, including: a memory cell array; a plurality of word lines arranged to extend in a first direction; a plurality of source lines arranged to extend in a first direction; a plurality of bit lines arranged to extend in a second direction different from the first direction; a first decoder circuit which selects at least one word line from among the plurality of word lines as a selected word line, and selects at least one source line from among the plurality of source lines as a selected source line; a second decoder circuit which selects at least one bit line from among the plurality of bit lines as a selected bit line; a power supply circuit which generates at least two voltages which are a rewrite voltage and a pre-charge voltage; a control circuit which generates: a clock signal and a pulse signal for applying the rewrite voltage to the memory cell array; a word line selection signal for selecting the selected word line; a bit line selection signal for selecting the selected bit line; a source line selection signal for selecting the selected source line; and a pre-charge enable signal for applying the pre-charge voltage to the plurality of bit lines and the plurality of source lines; and a pulse generator circuit which generates: a word-line pulse enable signal for controlling application of a pulse to the selected word line; a bit-line pulse enable signal and a bit-line discharge enable signal for controlling application of a pulse to the selected bit line; and a source-line pulse enable signal and a source-line discharge enable signal for controlling application of a pulse to the selected source line, wherein the memory cell array includes a plurality of memory cells, the plurality of memory cells each include a control element and a storage element, the control element and the storage element are connected to each other, the control element is connected to a word line included in the plurality of word lines, and to a source line included in the plurality of source lines, the storage element is connected to a bit line included in the plurality of bit lines, the plurality of word lines and the plurality of source lines are connected to the first decoder circuit, the plurality of bit lines is connected to the second decoder circuit, the word-line selection signal and the source-line selection signal are input to the first decoder circuit, the bit-line selection signal and the source-line selection signal are input to the second decoder circuit, the pre-charge enable signal is input to both of the first decoder circuit and the second decoder circuit, the clock signal and the pulse signal are input to the pulse generator circuit, the word-line pulse enable signal, the source-line pulse enable signal, and the source-line discharge enable signal are input to the first decoder circuit, the bit-line pulse enable signal and the bit-line discharge enable signal are input to the second decoder circuit, the rewrite voltage is applied to one of the first decoder circuit or the second decoder circuit, and the pre-charge voltage is applied to both of the first decoder circuit and the second decoder circuit.

The method for rewriting the semiconductor storage device and the semiconductor storage device make it possible to apply a high voltage to memory cells (for example, MOS transistors), and to reduce occurrence of a plurality of unstable-waveform application pulses and variation in the widths of the application pulses when timings for applying the write voltages have deviated due to wiring delay etc.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Underlying Knowledge Forming Basis of the Present Disclosure

Hereinafter, problems caused by the conventional semiconductor storage device described in the BACKGROUND section are described in detail.

First, conventional semiconductor storage device 10 is described.

Figure 12:
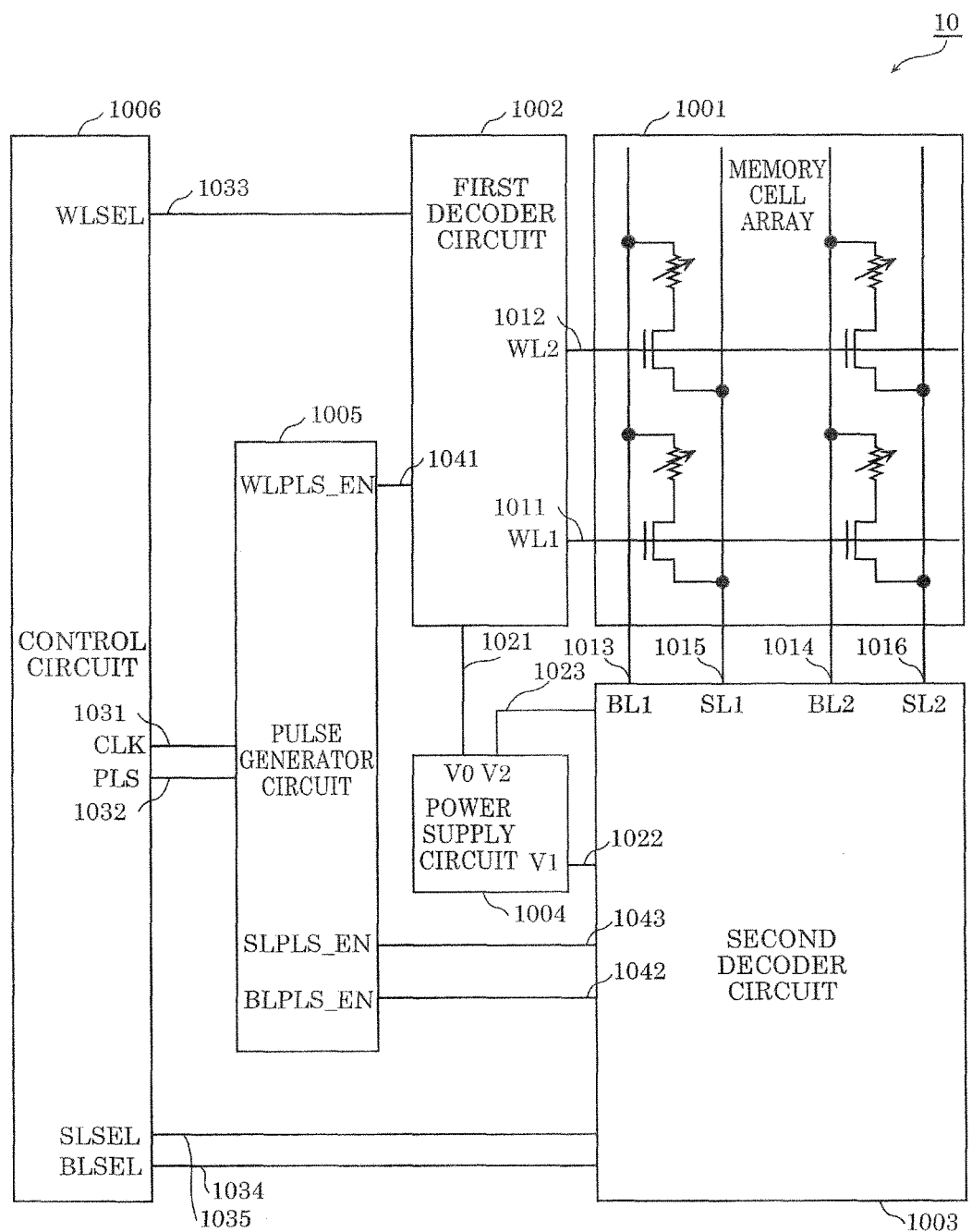
FIG. 12 is a circuit configuration diagram of a conventional semiconductor storage device.

FIG. 12 is a circuit configuration diagram of conventional semiconductor storage device 10.

Conventional semiconductor storage device 10 includes: memory cell array 1001, first decoder circuit 1002, second decoder circuit 1003, power supply circuit 1004, pulse generator circuit 1005, and control circuit 1006. Conventional semiconductor storage device 10 further includes a plurality of word lines, a plurality of bit lines, and a plurality of source lines. FIG. 12 shows word lines 1011 and 1012 as the plurality of word lines, bit lines 1013 and 1014 as the plurality of bit lines, and source lines 1015 and 1016 as the plurality of source lines.

Memory cell array 1001 includes a plurality of memory cells. Details of each memory cell are described later with reference to FIG. 15.

First decoder circuit 1002 selects, as a selected word line, at least one word line from the plurality of word lines.

Second decoder circuit 1003 selects, as a selected bit line, at least one bit line from among the plurality of bit lines, and selects, as a selected source line, at least one source line from among the plurality of source lines.

Power supply circuit 1004 generates rewrite voltages V0 to V2.

Control circuit 1006 generates clock signal CLK and pulse signal PLS for applying rewrite voltages V0, V1, and V2 to memory cell array 1001. In addition, control circuit 1006 generates word-line selection signal WLSEL for selecting a selected word line, generates bit-line selection signal BLSEL for selecting a selected bit line, and generates source-line selection signal SLSEL for selecting a selected source line.

Pulse generator circuit 1005 generates word-line pulse enable signal WLPLS_EN for controlling application of a pulse to the selected word line. Pulse generator circuit 1005 further generates bit-line pulse enable signal BLPLS_EN for controlling application of a pulse to the selected bit line. Pulse generator circuit 1005 further generates source-line pulse enable signal SLPLS_EN for controlling application of a pulse to the selected source line.

The plurality of word lines (1011 and 1012) are word lines of memory cell array 1001, arranged to extend in a first direction, and connected to first decoder circuit 1002. Memory cell array 1001 receives application of word-line voltages WL1 and WL2 via word lines 1011 and 1012.

The plurality of bit lines (1013 and 1014) are bit lines of memory cell array 1001, arranged to extend in a second direction different from the first direction, and connected to second decoder circuit 1003. Memory cell array 1001 receives application of bit-line voltages BL1 and BL2 via bit lines 1013 and 1014.

The plurality of source lines (1015 and 1016) are source lines of memory cell array 1001, are arranged to extend in the second direction, and are connected to second decoder circuit 1003. Memory cell array 1001 receives application of source-line voltages SL1 and SL2 via source lines 1015 and 1016.

Descriptions are given of conventional semiconductor storage device 10 which includes a memory cell array in which word lines 1011 and 1012 and bit lines 1013 and 1014 are orthogonal to each other, and bit lines 1013 and 1014 and source lines 1015 and 1016 are parallel to each other. A memory cell array in which word lines 1011 and 1012 and source lines 1015 and 1016 are parallel to each other is described later in Embodiment 5.

Power supply line 1021 is a power supply line which transmits rewrite voltage V0 generated by power supply circuit 1004, and is connected from power supply circuit 1004 to first decoder circuit 1002.

Power supply line 1022 is a power supply line which transmits rewrite voltage V1 generated by power supply circuit 1004, and is connected from power supply circuit 1004 to second decoder circuit 1003.

Power supply line 1023 is a power supply line which transmits rewrite voltage V2 generated by power supply circuit 1004, and is connected from power supply circuit 1004 to second decoder circuit 1003.

Clock signal line 1031 is a signal line which transmits clock signal CLK generated by control circuit 1006, and is connected from control circuit 1006 to pulse generator circuit 1005. In this way, clock signal CLK is input to pulse generator circuit 1005.

Pulse signal line 1032 is a signal line which transmits pulse signal PLS generated by control circuit 1006, and is connected from control circuit 1006 to pulse generator circuit 1005. In this way, pulse signal PLS is input to pulse generator circuit 1005.

Word-line selection signal line 1033 is a signal line which transmits word-line selection signal WLSEL generated by control circuit 1006, and is connected from control circuit 1006 to first decoder circuit 1002. In this way, word-line selection signal WLSEL is input to first decoder circuit 1002.

Bit-line selection signal line 1034 is a signal line which transmits bit-line selection signal BLSEL generated by control circuit 1006, and is connected from control circuit 1006 to second decoder circuit 1003. In this way, bit-line selection signal BLSEL is input to second decoder circuit 1003.

Source-line selection signal line 1035 is a signal line which transmits source-line selection signal SLSEL generated by control circuit 1006, and is connected from control circuit 1006 to second decoder circuit 1003. In this way, source-line selection signal SLSEL is input to second decoder circuit 1003.

Word-line pulse enable signal line 1041 is a signal line which transmits word-line pulse enable signal WLPLS_EN generated by pulse generator circuit 1005, and is connected from pulse generator circuit 1005 to first decoder circuit 1002. In this way, pulse enable signal WLPLS_EN is input to first decoder circuit 1002.

Bit-line pulse enable signal line 1042 is a signal line which transmits bit-line pulse enable signal BLPLS_EN generated by pulse generator circuit 1005, and is connected from pulse generator circuit 1005 to second decoder circuit 1003. In this way, bit-line pulse enable signal BLPLS_EN is input to second decoder circuit 1003.

Source-line pulse enable signal line 1043 is a signal line which transmits source-line pulse enable signal SLPLS_EN generated by pulse generator circuit 1005, and is connected from pulse generator circuit 1005 to second decoder circuit 1003. In this way, source-line pulse enable signal SLPLS_EN is input to second decoder circuit 1003.

Next, conventional semiconductor storage device 10 is described.

Figure 13A:
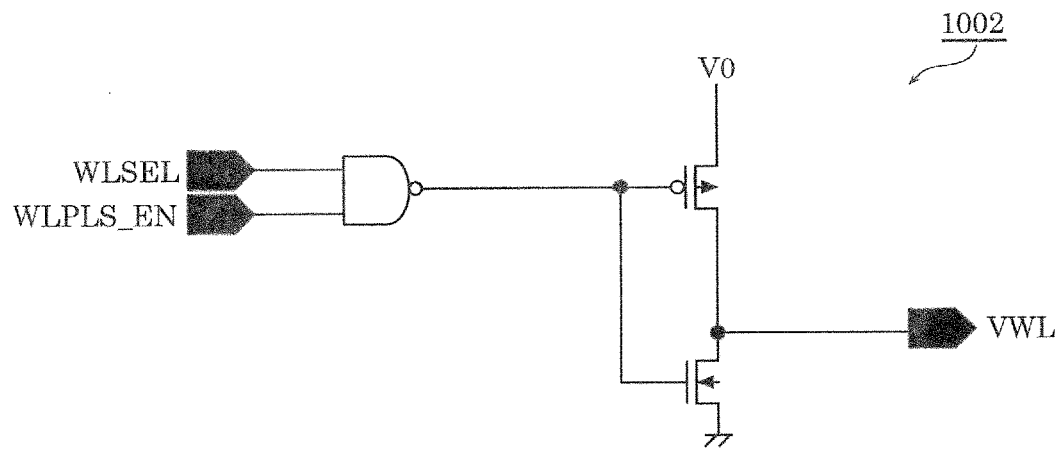
FIG. 13A is a circuit diagram of the first decoder circuit illustrated in FIG. 12.
Figure 13B:
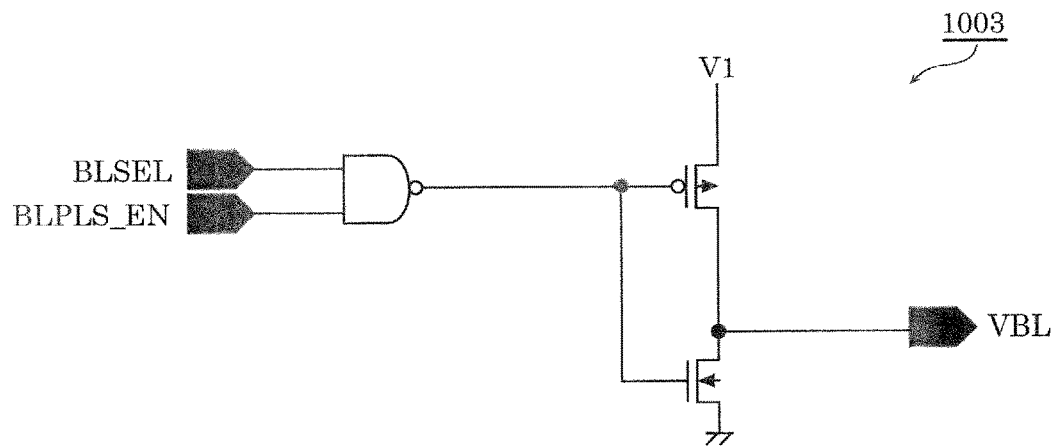
FIG. 13B is a circuit diagram of the second decoder circuit illustrated in FIG. 12.
Figure 13C:
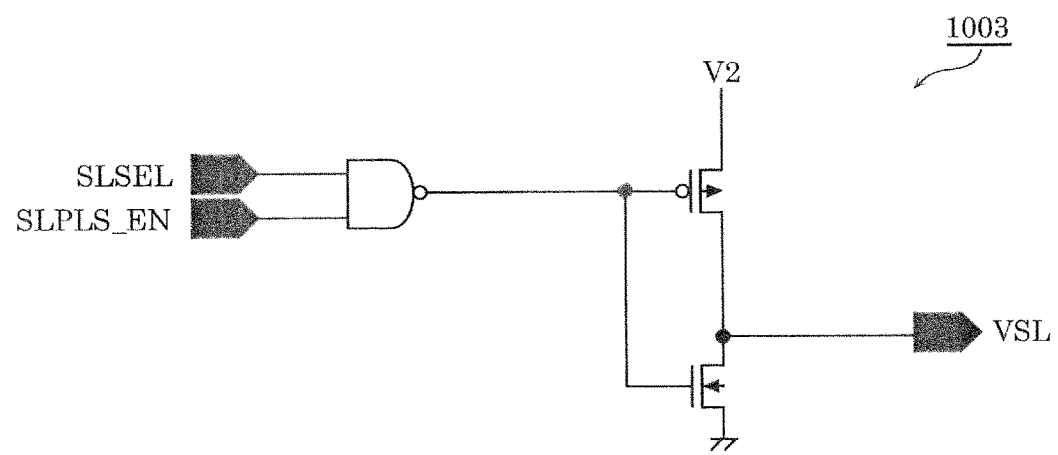
FIG. 13C is a circuit diagram of the second decoder circuit illustrated in FIG. 12.

FIGS. 13A to 13C are each a circuit diagram of a decoder circuit in conventional semiconductor storage device 10.

FIG. 13A is a circuit diagram of first decoder circuit 1002 illustrated in FIG. 12. First decoder circuit 1002 generates word-line voltage VWL from word-line selection signal WLSEL and word-line pulse enable signal WLPLS_EN. When a word line is selected, both of word-line selection signal WLSEL and word-line pulse enable signal WLPLS_EN are set to "H". In this case, voltage V0 is output as word-line voltage VWL. When no word line is selected, either one or both of word-line selection signal WLSEL and word-line pulse enable signal WLPLS_EN are set to "L". In this case, ground voltage VSS (=0 V) is output as word-line voltage VWL.

FIG. 13B is a circuit diagram of second decoder circuit 1003 illustrated in FIG. 12. Second decoder circuit 1003 generates bit-line voltage VBL from bit-line selection signal BLSEL and bit-line pulse enable signal BLPLS_EN. Specific operations are the same as the operations described with reference to FIG. 13A, and thus descriptions thereof are not repeated.

FIG. 13C is a circuit diagram of second decoder circuit 1003 illustrated in FIG. 12. Second decoder circuit 1003 generates bit-line voltage VSL from source-line selection signal SLSEL and source-line pulse enable signal SLPLS_EN. Specific operations are the same as the operations described with reference to FIG. 13A, and thus descriptions thereof are not repeated.

Next, rewrite operations performed by conventional semiconductor storage device 10 is described.

FIGS. 14A to 14D are each a timing chart of rewriting conventional semiconductor storage device 10.

Figure 14A:
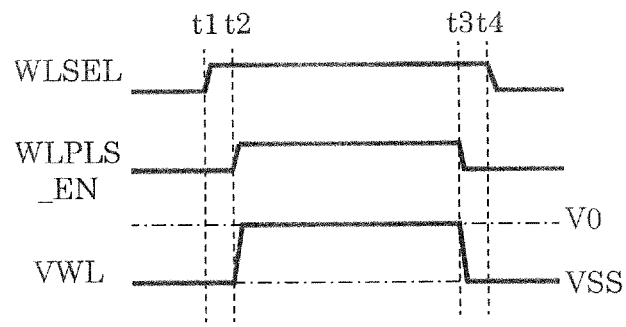
FIG. 14A is a timing chart for the first decoder circuit illustrated in FIG. 13A.
Figure 14B:
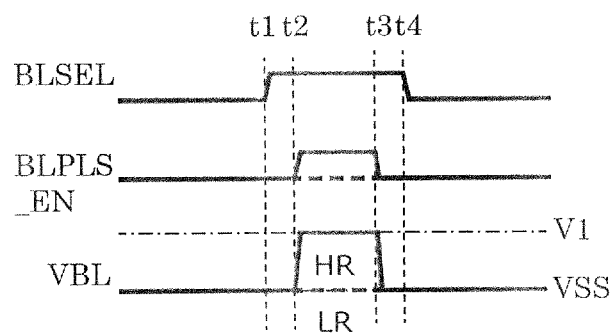
FIG. 14B is a timing chart for the second decoder circuit illustrated in FIG. 13B.
Figure 14C:
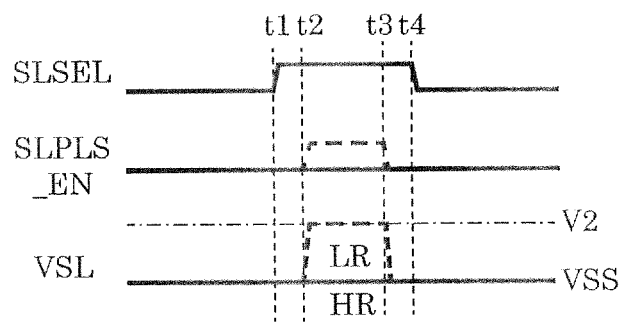
FIG. 14C is a timing chart for the second decoder circuit illustrated in FIG. 13C.
Figure 14D:
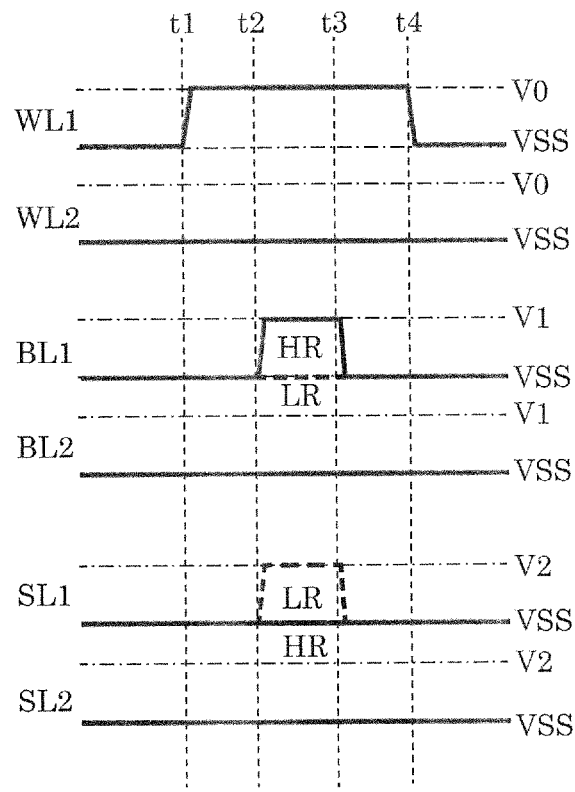
FIG. 14D is a timing chart of a word-line voltage, a bit-line voltage, and a source-line voltage illustrated in FIG. 12.

FIG. 14A is a timing chart for first decoder circuit 1002 illustrated in FIG. 13A. FIG. 14B is a timing chart of second decoder circuit 1003 illustrated in FIG. 13B. FIG. 14C is a timing chart for second decoder circuit 1003 illustrated in FIG. 13C. FIG. 14D is a timing chart of word-line voltages WL1 and WL2, bit-line voltages BL1 and BL2, and source-line voltages SL1 and SL2 illustrated in FIG. 12.

As illustrated in FIG. 14A, word-line voltage VWL for rewriting is set to rewrite voltage V0 between t2 to t3, and is applied to memory cells described later. As illustrated in FIG. 14B, in order to set memory cells to a high resistance state (HR), bit-line voltage VBL is set to rewrite voltage V1 between t2 and t3, and is applied to the memory cells. On the other hand, in order to set memory cells to a low resistance state (LR), bit-line voltage VBL is set to rewrite voltage VSS (=0) between t2 and t3 and is applied to the memory cells. As illustrated in FIG. 14C, in order to set memory cells to HR, source-line voltage VSL is set to rewrite voltage VSS (=0 V) between t2 and t3, and is applied to the memory cells. On the other hand, in order to set memory cells to LR, source-line voltage VSL is set to rewrite voltage V2 between t2 and t3, and is applied to the memory cells. An element whose resistance is changed by application of different-polarity voltages between when the memory cells are set to HR and to LR in this way is referred to as a bipolar element. On the other hand, an element whose resistance is changed by application of same-polarity voltages between when the memory cells are set to HR and to LR in this way is referred to as a unipolar element. It is to be noted that a bipolar variable resistance memory described here is a non-limiting example.

FIG. 14D is a timing chart indicating a timing at which memory cells were rewritten after word line 1011, bit line 1013, and source line 1015 illustrated in FIG. 12 are selected. Word line 1011, bit line 1013, and source line 1015 receive application of word-line voltage WL1, bit-line voltage BL1, and source-line voltage SL1, respectively, which are illustrated in FIGS. 14A to 14C. On the other hand, word line 1012, bit line 1014, and source line 1016 connected to non-rewritable memory cells receive application of word-line voltage WL2, bit-line voltage BL2, and source-line voltage SL2, respectively, which are ground voltages VSSs (=0 V).

Next, conventional semiconductor storage device 10 is described.

Figure 15:
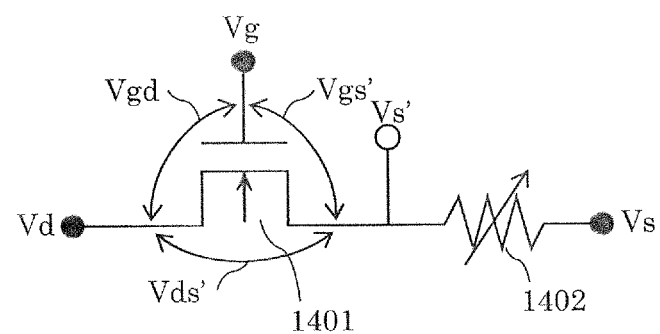
FIG. 15 is a configuration diagram of a memory cell of a semiconductor storage device.

FIG. 15 is a configuration diagram of a memory cell of semiconductor storage device 10.

Each of the plurality of memory cells included in memory cell array 1001 includes control element 1401 and storage element 1402. Control element 1401 is, for example, a diode, a transistor, or the like. Storage element 1402 is, for example, a capacitor, a charge storage element, a variable resistance element, a ferroelectric element, a magnetoresistive element, a phase-change element, or the like. Control element 1401 and storage element 1402 are connected to each other. More specifically, as illustrated in FIG. 15, a MOS transistor or the like as control element 1401 and a variable resistance element or the like as storage element 1402 are connected to each other in series. In addition, control element 1401 is connected to one word line included in the plurality of word lines and to one source line included in the plurality of source lines. Storage element 1402 is connected to one bit line included in the plurality of bit lines.

In FIG. 15, Vg denotes a voltage to be applied to the gate of the MOS transistor, Vd denotes a voltage to be applied to the drain, and Vs denotes a voltage to be applied via the variable resistance element. In addition, Vs' denotes an intermediate potential between potentials of the MOS transistor and the variable resistance element, Vgd denotes a potential difference between Vg and Vd, Vgs' denotes a potential difference between Vg and Vs', and Vds' denotes a potential difference between Vd and Vs'. Here, a state of bias to a memory cell between t1 and t2 illustrated in FIG. 14D is calculated. Between t1 and t2, voltages that satisfy Vg=V0 (for example, 3 V), Vd=VSS (=0 V), and Vs=VSS (=0 V) are applied to the memory cell. Accordingly, since no current flows between Vd and Vs, Vs'=0 V is satisfied. In this way, Vgd=3 V, Vgs'=3 V, and Vds'=0 V can be calculated.

Refinement of semiconductor storage devices reduces the sizes of MOS transistors included therein, and reduces the thicknesses of oxide films of the MOS transistors. This makes it difficult to apply a high voltage to the MOS transistors. For example, it becomes difficult to apply a bias voltage of 3 V to a MOS transistor in a 1.1 V line.

Next, a method for applying a high voltage to the MOS transistor disclosed in PTL 1 is described with reference to FIGS. 14D and 15.

In the section other than the t2-t3 section illustrated in FIG. 14D, a pre-charge voltage VPRE (for example, 1.5 V) is applied to Vd and Vs. The state of bias to a memory cell in the t1-t2 section illustrated in FIG. 14D is calculated. In the t1-t2 section, voltages that satisfy Vg=V0 (for example, 3 V), Vd =VPRE (for example, 1.5 V), and Vs=VRPE (for example, 1.5 V) are applied to the memory cell. Accordingly, since no current flows between Vd and Vs, Vs'=1.5 V is satisfied. In this way, Vgd=1.5 V, Vgs'=1.5 V, and Vds'=0 V can be calculated. In this way, compared to the case where no pre-charge voltage VPRE is applied to Vd and Vs, an application bias voltage to be applied to the MOS transistor decreases significantly.

Next, problems that arise when a high voltage is applied to the MOS transistor disclosed in PTL 1 are described.

FIGS. 16A to 16E are each a diagram showing the problems that arise when the method disclosed by PTL 1 is applied.

Figure 16A:
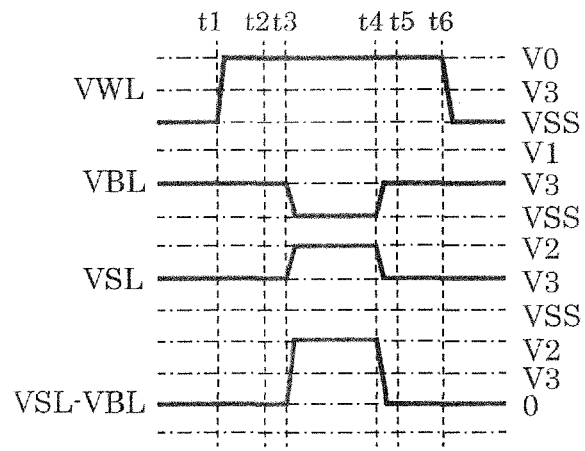
FIG. 16A is a timing chart for the conventional semiconductor storage device when timings for applying write voltages have not deviated.

FIG. 16A is a timing chart for conventional semiconductor storage device 10 when timings for applying write voltages have not deviated. VSL-VBL shown in FIG. 16A indicates a waveform obtained by subtracting bit-line voltage VBL from source-line voltage VSL, and is an application pulse for changing the resistance value of the variable resistance element. The memory cell is set to LR when the application pulse has a positive value, and is set to HR when the application pulse has a negative value. In FIG. 16A, bit-line voltage VBL and source-line voltage VSL are switched at t3 and t4. Hereinafter, a method for applying voltages having these pulse waveforms is referred to as a simultaneous pulse method. However, in the simultaneous pulse method, timings for applying write voltages may deviate due to wiring delay etc.

Figure 16B:
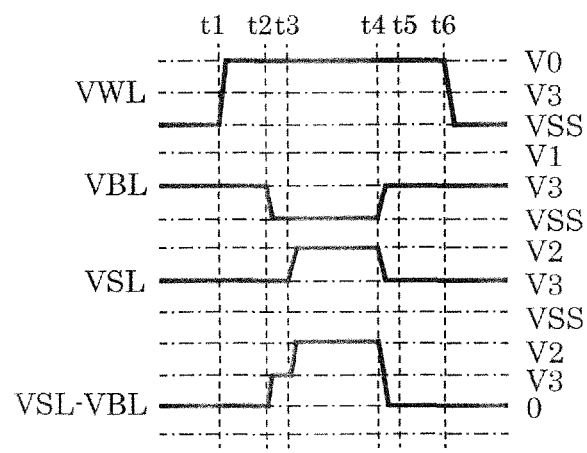
FIG. 16B is a timing chart for the conventional semiconductor storage device when timings for applying write voltages have deviated.
Figure 16C:
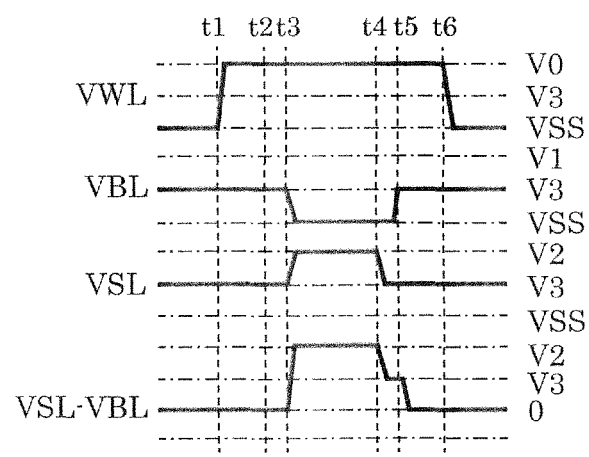
FIG. 16C is a timing chart for the conventional semiconductor storage device when timings for applying write voltages have deviated.
Figure 16D:
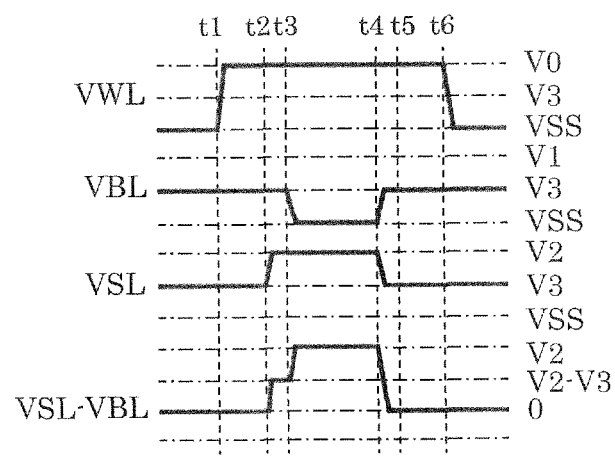
FIG. 16D is a timing chart for the conventional semiconductor storage device when timings for applying write voltages have deviated.
Figure 16E:
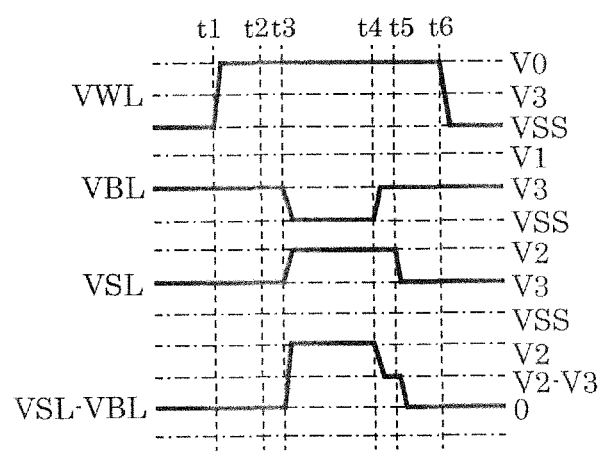
FIG. 16E is a timing chart for the conventional semiconductor storage device when timings for applying write voltages have deviated.

FIGS. 16B to 16E are each a timing chart for conventional semiconductor storage device 10 when timings for applying write voltages have deviated. In FIG. 16B, bit-line voltage VBL becomes rewrite voltage VSS (=0 V) at t2, and the waveform of VSL-VBL changed. In FIG. 16C, bit-line voltage VBL becomes pre-charge voltage V3 at t5, and the waveform of VSL-VBL changed. In FIG. 16D, source-line voltage VSL becomes rewrite voltage V2 at t2, and the waveform of VSL-VBL changed. In FIG. 16E, source-line voltage VSL becomes pre-charge voltage V3 at t5, and the waveform of VSL-VBL changed. As illustrated in FIGS. 16B to 16E, when timings for applying write voltages have deviated, a plurality of unstable-waveform application pulses are generated, which result in significant variation in the widths of the application pulses.

Hereinafter, methods for rewriting semiconductor storage devices according to embodiments of the present disclosure and the semiconductor storage devices are described with reference to the drawings. It is to be noted that each of the exemplary embodiments described below shows a general or specific example. The numerical values, shapes, materials, constituent elements, the arrangement and connection of the constituent elements etc. described in the following exemplary embodiments are mere examples, and therefore do not limit the scope of the present disclosure. Therefore, among the constituent elements in the following exemplary embodiments, constituent elements not recited in any one of the independent claims that define the most generic concept of the present disclosure are described as arbitrary constituent elements.

In addition, each diagram is a schematic diagram, and thus is not always illustrated precisely. The same constituent elements are provided with the same reference numerals throughout the drawings.

It is to be noted that a semiconductor storage device including a bipolar variable resistance memory is described below as a non-limiting example.

Embodiment 1

Hereinafter, Embodiment 1 is described with reference to FIG. 1A to FIG. 4C.

Figure 1A:
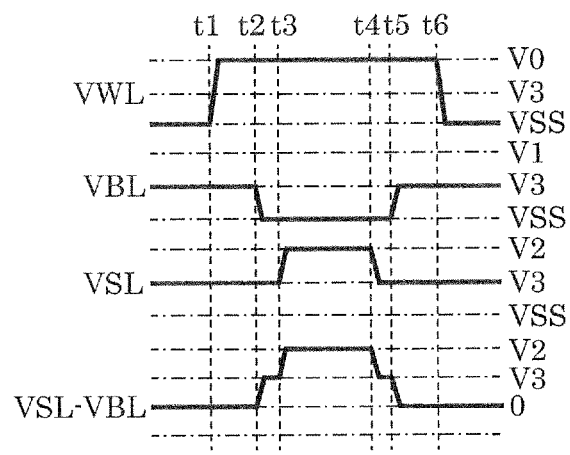
FIG. 1A is a timing chart of rewriting a semiconductor storage device according to Embodiment 1.
Figure 1B:
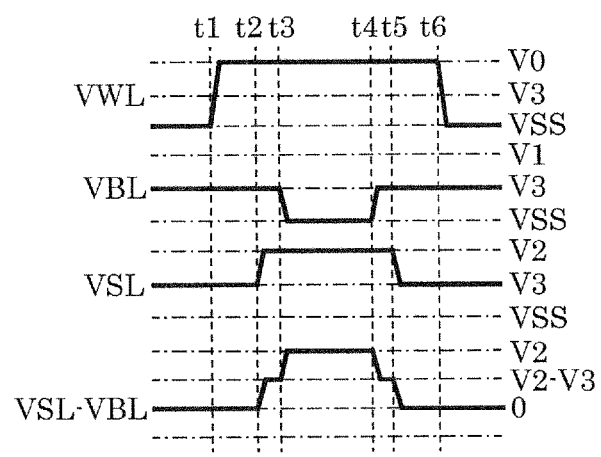
FIG. 1B is a timing chart of rewriting a semiconductor storage device according to Embodiment 1.

FIGS. 1A and 1B are each a timing chart of rewriting semiconductor storage device 1 according to Embodiment 1.

FIGS. 1A and 1B are each indicates a bias state at the time when a selected memory cell is set to LR.

Here, at least one word line is selected from among the plurality of word lines as a selected word line. In addition, at least one bit line is selected from among the plurality of bit lines as a selected bit line, and at least one source line is selected from among the plurality of source lines as a selected source line.

First, pre-charge voltage V3 is applied to both of the plurality of bit lines and the plurality of source lines (a first rewriting step). Next, a rewrite voltage (VSS (=0 V), V1 or V2) is applied to one of the selected bit line or the selected source line (a second rewriting step). Next, a rewrite voltage (VSS (=0 V), V1 or V2) is applied to both of the selected bit line and the selected source line (a third rewriting step). Subsequently, pre-charge voltage V3 is applied to one of the selected bit line or the selected source line (a fourth rewriting step). Lastly, pre-charge voltage V3 is applied to both of the selected bit line and the selected source line (a fifth rewriting step). It is to be noted that the first to fifth rewriting steps may be performed in sequence. In other words, it is not always necessary to perform different operations between steps.

Specific operations performed in the first to fifth rewriting steps are described below.

As illustrated in FIG. 1A, first, pre-charge voltage V3 is applied to a selected bit line and a selected source line (VBL=V3, VSL=V3). Rewrite voltage V0 is applied to a selected word line between t1 and t6 (VWL=V0). To the selected bit line, rewrite voltage VSS (=0 V) is applied between t2 and t5 (VBL=VSS), and then pre-charge voltage V3 is applied (VBL=V3). To the selected source line, rewrite voltage V2 is applied between t3 and t4 (VSL=V2), and then pre-charge voltage V3 is applied (VSL=V3). In addition, ground voltage VSS (=0 V) is applied to a non-selected word line, and pre-charge voltage V3 is applied to a non-selected bit line and a non-selected source line. At this time, voltage VSS (=0 V) is used for grounding or rewriting. Here, pre-charge voltage V3 is set to an intermediate voltage between rewrite voltage V3 (or V1) and 0 V.

In FIG. 1A, selected bit-line voltage VBL and selected source-line voltage VSL are switched not at the same time but with time differences (t3-t2 and t5-t4). In this way, the pulse waveform of the selected bit-line voltage VBL covers the pulse waveform of the selected source-line voltage VSL. Hereinafter, a method for applying voltages having such pulse waveforms to memory cells is referred to as a cover pulse method.

VSL-VBL indicates a voltage having a pulse waveform obtained by subtracting selected bit-line voltage VBL from selected source-line voltage VSL. The memory cell is set to LR when the value of VSL-VBL is a positive value, and is set to HR when the value of VSL-VBL is a negative value. Here, an example of setting the memory cell to LR is shown, and VSL-VBL indicates a positive value. On the other hand, when the memory cell is set to HR, rewrite voltage V1 is applied to a selected bit line, and rewrite voltage VSS (=0 V) is applied to a selected source line. In this case, VSL-VBL indicates a negative value.

Compared to FIG. 16A illustrating the conventional simultaneous pulse method, FIG. 1A shows that the waveform of VSL-VBL has protrusions in the t2-t3 section and the t4-t5 section. However, when timings for applying voltages have deviated due to wiring delay etc. as in FIGS. 16B to 16E, a plurality of unstable-waveform application pulses as in the simultaneous pulse method are unlikely to be generated, which can reduce variation in the widths of the application pulses.

In addition, FIG. 1B illustrates another example of a pulse application method. In FIG. 1A, the pulse waveform of the selected bit-line voltage VBL covers the pulse waveform of the selected source-line voltage VSL. On the other hand, in FIG. 1B, the pulse waveform of the selected source-line voltage VSL covers the pulse waveform of the selected bit-line voltage VBL. When pre-charge voltage V3 is half of rewrite voltage V2, the waveform of VSL-VBL has completely the same shape as in FIG. 1A. In this way, even when the pulse wave of the selected source-line voltage VSL covers the pulse waveform of the selected bit-line voltage VBL, a plurality of unstable-waveform application pulses as in the simultaneous pulse method are unlikely to be generated, which can reduce variation in the widths of the application pulses.

Next, a configuration of semiconductor storage device 1 according to Embodiment 1 is described.

Figure 2:
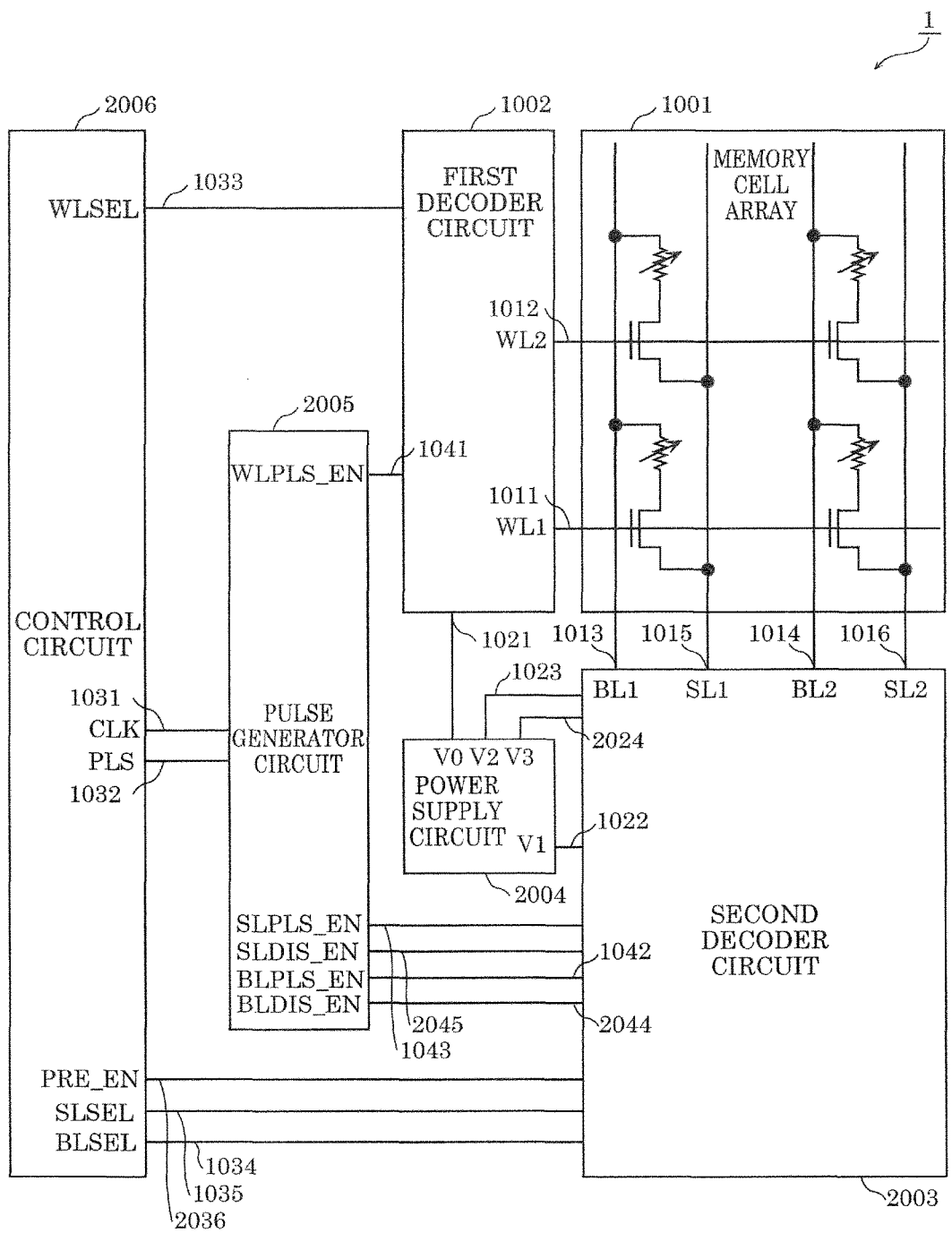
FIG. 2 is a circuit configuration diagram of the semiconductor storage device according to Embodiment 1.

FIG. 2 is a circuit configuration diagram of semiconductor storage device 1 according to Embodiment 1.

Here, differences from the circuit configuration of conventional semiconductor storage device 10 illustrated in FIG. 12 are described. Semiconductor storage device 1 according to this embodiment includes second decoder circuit 2003 instead of second decoder circuit 1003, and includes power supply circuit 2004 instead of power supply circuit 1004. Semiconductor storage device 1 further includes pulse generator circuit 2005 instead of pulse generator circuit 1005, and includes control circuit 2006 instead of control circuit 1006. Furthermore, semiconductor storage device 1 includes power supply line 2024, pre-charge enable signal line 2036, bit-line discharge enable signal line 2044, and source-line discharge enable signal line 2045. These points are differences between semiconductor storage device 1 and conventional semiconductor storage device 10. Since the other constituent elements of semiconductor storage device 1 are the same as those of semiconductor storage device 10, descriptions thereof are not repeated.

Second decoder circuit 2003 has the same function as the function of second decoder circuit 1003. To second decoder circuit 2003, the following elements are connected: power supply line 2024, pre-charge enable signal line 2036, bit-line discharge enable signal line 2044, and source-line discharge enable signal line 2045.

Power supply circuit 2004 has the same function as the function of power supply circuit 1004, and generates at least two voltages which are rewrite voltages V0 to V2 and pre-charge voltage V3. In this embodiment, rewrite voltages V0 to V2 and pre-charge voltage V3 are applied to corresponding one(s) of first decoder circuit 1002 second decoder circuit 2003. More specifically, rewrite voltage V0 is applied to first decoder circuit 1002, and rewrite voltages V1 and V2 and pre-charge voltage V3 are applied to second decoder circuit 2003.

Control circuit 2006 has the same function as the function of control circuit 1006, and generates pre-charge enable signal PRE_EN for applying pre-charge voltage V3 to the plurality of bit lines and the plurality of source lines.

Pulse generator circuit 2005 has the same function as the function of pulse generator circuit 2005. In addition, pulse generator circuit 2005 generates bit-line pulse enable signal BLPLS_EN and bit-line discharge enable signal BLDIS_EN both for controlling application of a pulse to the selected bit line. In addition, pulse generator circuit 1005 further generates source-line pulse enable signal SLPLS_EN and source-line discharge enable signal SLDIS_EN both for controlling application of a pulse to the selected source line.

Power supply line 2024 is a power supply line which transmits pre-charge voltage V3 generated by power supply circuit 2004, and is connected from power supply circuit 2004 to second decoder circuit 2003.

Pre-charge enable signal line 2036 is a signal line which transmits pre-charge enable signal PRE_EN generated by control circuit 2006, and is connected from control circuit 2006 to second decoder circuit 2003. In this way, pre-charge enable signal PRE_EN is input to second decoder circuit 2003.

Bit-line discharge enable signal line 2044 is a signal line which transmits bit-line discharge enable signal BLDIS_EN generated by pulse generator circuit 2005, and is connected from pulse generator circuit 2005 to second decoder circuit 2003. In this way, bit-line discharge enable signal BLDIS_EN is input to second decoder circuit 2003.

Source-line discharge enable signal line 2045 is a signal line which transmits source-line discharge enable signal SLDIS_EN generated by pulse generator circuit 2005, and is connected from pulse generator circuit 2005 to second decoder circuit 2003. In this way, source-line discharge enable signal SLDIS_EN is input to second decoder circuit 2003.

Next, descriptions are given of a configuration of pulse generator circuit 2005 and a timing chart indicating a timing at which memory cells are rewritten.

Figure 3A:
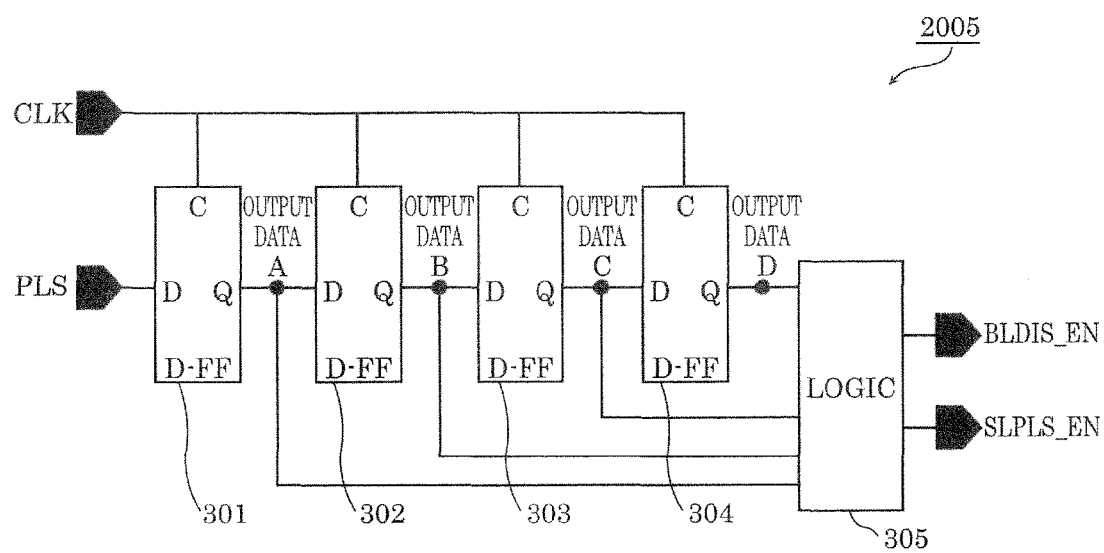
FIG. 3A is a circuit diagram of a pulse generator circuit of the semiconductor storage device according to Embodiment 1.
Figure 3B:
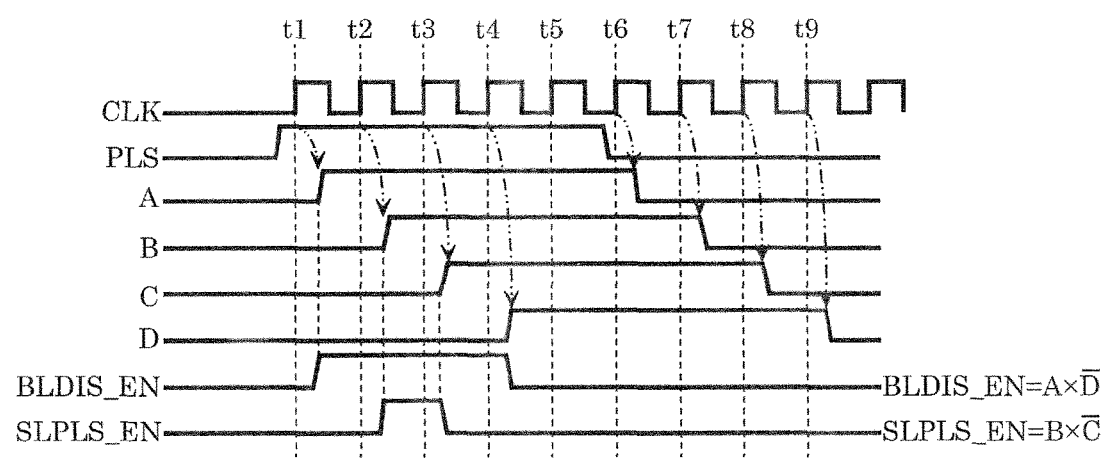
FIG. 3B is a timing chart for the pulse generator circuit of the semiconductor storage device according to Embodiment 1.

FIG. 3A is a circuit diagram of pulse generator circuit 2005 of semiconductor storage device 1 according to Embodiment 1. FIG. 3B is a timing chart of rewriting by pulse generator circuit 2005 of semiconductor storage device 1 according to Embodiment 1.

FIG. 3A illustrates an example of pulse generator circuit 2005. As illustrated in FIG. 3A, pulse generator circuit 2005 receives inputs of clock signal CLK and pulse signal PLS. In addition, pulse generator circuit 2005 outputs bit-line discharge enable signal BLDIS_EN and source-line pulse enable signal SLPLS_EN. D-flip-flop circuits 301 to 304 are connected in series, receive clock signal CLK and pulse signal PLS, and outputs output data A to D, respectively. Logic circuit 305 receives inputs of output data A to D of D-flip-flop circuits 301 to 304, and outputs bit-line discharge enable signal BLDIS_EN and source-line pulse enable signal SLPLS_EN.

FIG. 3B illustrates a timing chart of rewriting by pulse generator circuit 2005. In FIG. 3B, pulses are generated so that the pulse waveform of bit-line voltage VBL covers the pulse waveform of source-line voltage VSL. At timing (t1) at which clock signal CLK rises from "L" to "H", input pulse signal PLS is taken in, and output data A is output with a time difference. The value of output data is changed only at the timing at which clock signal CLK rises from "L" to "H", that is, the previous value of output data is maintained until the timing. Since D-flip-flop circuits 301 and 302 are connected in series, output data B is output with a delay corresponding to a clock period from a time of output of output data A. Hereinafter, output data C is output with a delay corresponding to a clock period from a time of output of output data B, and output data D is output with a delay corresponding to a clock period from a time of output of output data C. In this way, D-flip-flop circuits are used as delay circuits. By output data A to D of D-flip-flop circuits 301 to 304 being subjected to logical operations by logic circuit 305, bit-line discharge enable signal BLDIS_EN and source-line pulse enable signal SLPLS_EN are generated. Here, bit-line discharge enable signal BLDIS_EN and source-line pulse enable signal SLPLS_EN are represented as (A) AND (NOT D) and (B) AND (NOT C), respectively.

Next, descriptions are given of a configuration of second decoder circuit 2003 and a timing chart indicating a timing at which memory cells are rewritten.

Figure 4A:
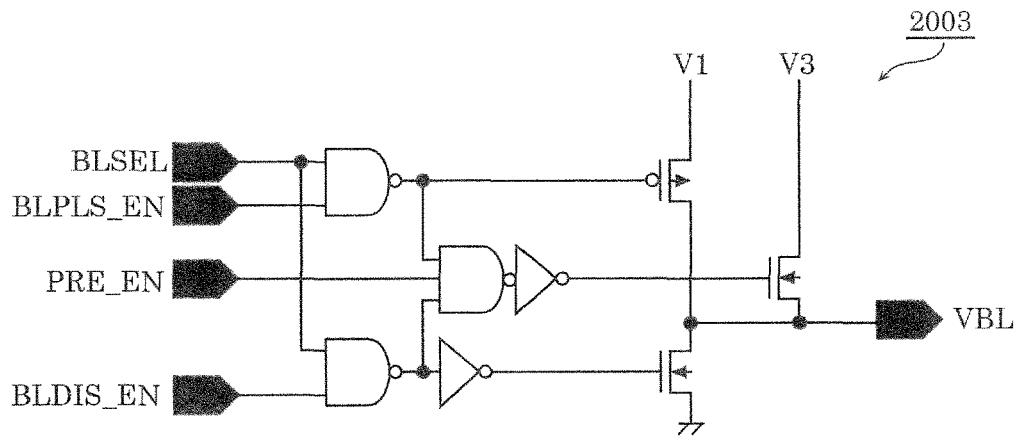
FIG. 4A is a circuit diagram of a second decoder circuit of the semiconductor storage device according to Embodiment 1.
Figure 4B:
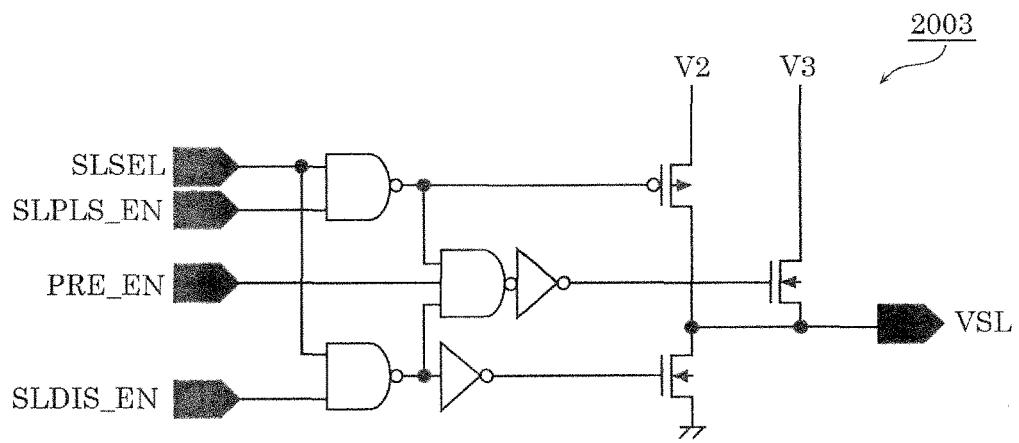
FIG. 4B is a circuit diagram of a second decoder circuit of the semiconductor storage device according to Embodiment 1.
Figure 4C:
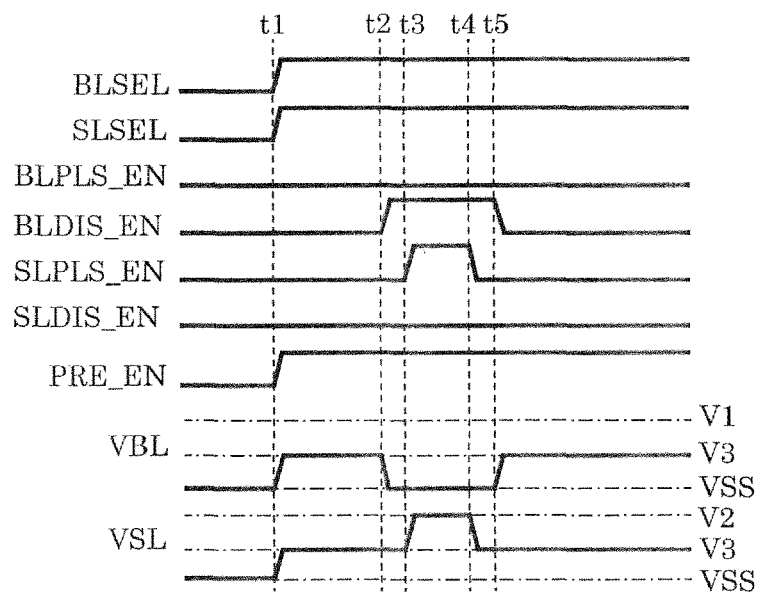
FIG. 4C is a timing chart for the second decoder circuit of the semiconductor storage device according to Embodiment 1.

FIGS. 4A and 4B are each a circuit diagram of second decoder circuit 2003 of semiconductor storage device 1 according to Embodiment 1. FIG. 4C is a timing chart of rewriting by second decoder circuit 2003 of semiconductor storage device 1 according to Embodiment 1.

FIG. 4A illustrates an example of a bit-line decoder circuit of second decoder circuit 2003. As illustrated in FIG. 4A, second decoder circuit 2003 receives inputs of bit-line selection signal BLSEL, bit-line pulse enable signal BLPLS_EN, pre-charge enable signal PRE_EN, and bit-line discharge enable signal BLDIS_EN. In addition, second decoder circuit 2003 outputs bit-line voltage VBL. When both of bit-line selection signal BLSEL and bit-line pulse enable signal BLPLS_EN are "H", rewrite voltage V1 is output as bit-line voltage VBL. When both of bit-line selection signal BLSEL and bit-line discharge enable signal BLDIS_EN are "H", rewrite voltage VSS (=0 V) is output as bit-line voltage VBL. It is to be noted that bit-line pulse enable signal BLPLS_EN and bit-line discharge enable signal BLDIS_EN do not become "H" simultaneously. Pre-charge voltage V3 is output as bit-line voltage VBL under the conditions that: pre-charge enable signal PRE_EN is "H", bit-line selection signal BLSEL and bit-line pulse enable signal BLPLS_EN are not "H", and bit-line selection signal BLSEL and bit-line discharge enable signal BLDIS_EN are not "H".

FIG. 4B illustrates an example of a source-line decoder circuit of second decoder circuit 2003. Operations in FIG. 4B are the same as the operations performed in bit-line decoder circuit illustrated in FIG. 4A except that bit lines are replaced with source lines, and that rewrite voltage V1 is replaced with rewrite voltage V2. Thus, descriptions of the operations are omitted.

FIG. 4C illustrates a timing chart of rewriting by second decoder circuit 2003. At t1, bit-line selection signal BLSEL and pre-charge enable signal PRE_EN change from "L" to "H". Bit-line pulse enable signal BLPLS_EN and bit-line discharge enable signal BLDIS_EN are "L", and thus pre-charge voltage V3 is output as bit-line voltage VBL. Likewise, pre-charge voltage V3 is output as source-line voltage VSL. At t2, bit-line discharge enable signal BLDIS_EN changes from "L" to "H", and rewrite voltage VSS (=0 V) is output as bit-line voltage VBL. At t3, source-line pulse enable signal SLPLS_EN changes from "L" to "H", and rewrite voltage V2 is output as source-line voltage VSL. At t4, source-line pulse enable signal SLPLS_EN changes from "H" to "L", and pre-charge voltage V3 is output as source-line voltage VSL. At t5, bit-line discharge enable signal BLDIS_EN changes from "H" to "L", and pre-charge voltage V3 is output as bit-line voltage VBL.

Although an operation for changing a memory cell to LR is represented by a positive value obtained from VSL-VBL here, an operation for changing a memory cell to HR represented by a negative value obtained from VSL-VBL is also performed similarly.

In the method for rewriting semiconductor storage device 1 and semiconductor storage device 1 according to this embodiment, pre-charge voltage V3 is applied to bit lines and source lines when semiconductor storage device 1 is rewritten. This makes it possible to apply a high voltage to the memory cell (for example, a MOS transistor). Furthermore, according to the cover pulse method considering differences in voltage application timing due to wiring delay etc., it is possible to reduce occurrence of a plurality of unstable-waveform application pulses and variation in the widths of the application pulses.

Embodiment 2

Hereinafter, Embodiment 2 is described with reference to FIG. 5A to FIG. 5E.

The configuration of semiconductor storage device 2 according to this embodiment is the same as that of semiconductor storage device 1, and thus descriptions thereof are not repeated.

FIGS. 5A to 5E are each a timing chart of rewriting semiconductor storage device 2 according to Embodiment 2.

FIGS. 5A to 5E each illustrate a bias state at the time when a selected memory cell is set to LR.

Here, at least one word line is selected from among the plurality of word lines as a selected word line. In addition, at least one bit line is selected from among the plurality of bit lines as a selected bit line, and at least one source line is selected from among the plurality of source lines as a selected source line.

First, pre-charge voltage V3 is applied to both of the plurality of bit lines and the plurality of source lines (a first rewriting step). Next, both of the selected bit line and the selected source line are grounded (a second rewriting step). Next, rewrite voltage (VSS (=0 V), V1 or V2) is applied to both of the selected bit line and the selected source line (a third rewriting step). Next, both of the selected bit line and the selected source line are grounded (a fourth rewriting step). Lastly, pre-charge voltage V3 is applied to both of the selected bit line and the selected source line (a fifth rewriting step). It is to be noted that the first to fifth rewriting steps may be performed in sequence. In other words, it is not always necessary to perform different operations between steps.

Specific operations performed in the first to fifth rewriting steps are described below.

Figure 5A:
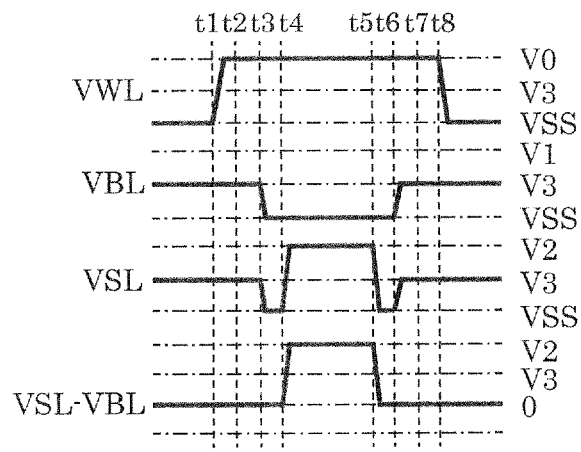
FIG. 5A is a timing chart of rewriting a semiconductor storage device according to Embodiment 2.
Figure 5B:
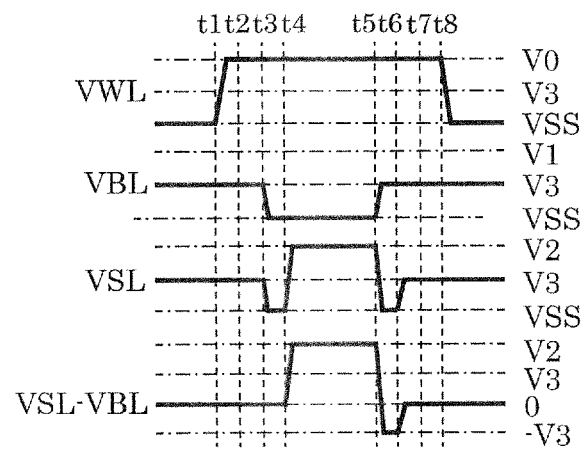
FIG. 5B is a timing chart of rewriting the semiconductor storage device according to Embodiment 2.
Figure 5C:
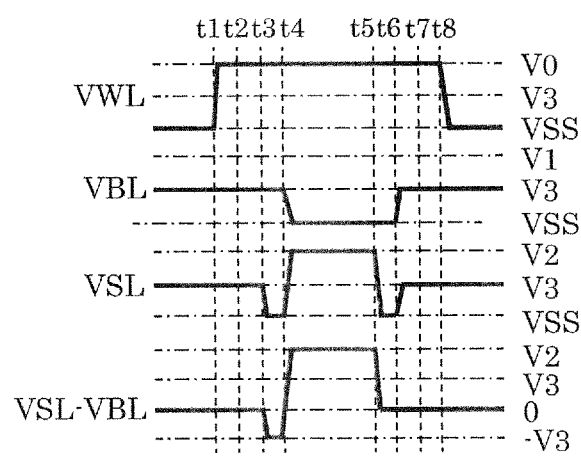
FIG. 5C is a timing chart of rewriting the semiconductor storage device according to Embodiment 2.
Figure 5D:
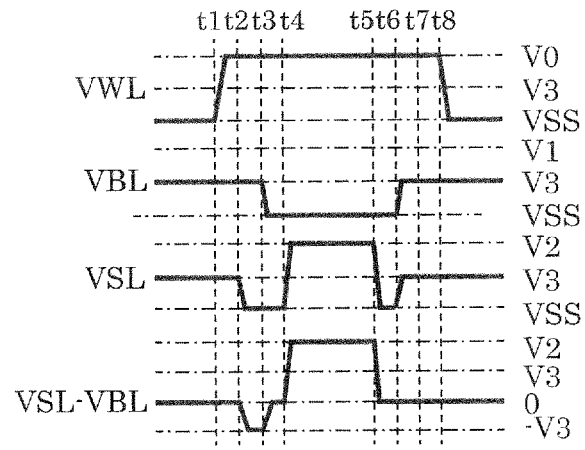
FIG. 5D is a timing chart of rewriting the semiconductor storage device according to Embodiment 2.
Figure 5E:
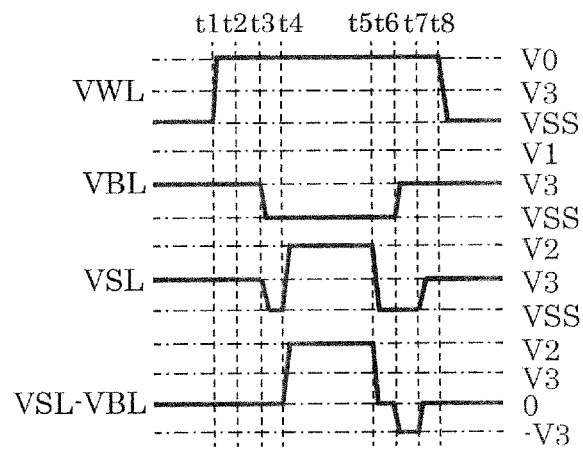
FIG. 5E is a timing chart of rewriting the semiconductor storage device according to Embodiment 2.

As illustrated in FIG. 5A, first, pre-charge voltage V3 is applied to a selected bit line and a selected source line (VBL=V3, VSL=V3). Rewrite voltage V0 is applied to a selected word line between t1 and t8 (VWL=V0). The selected bit line is grounded between t3 and t4 and between t5 and t6 (VBL=VSS), and to the selected bit line, rewrite voltage VSS (=0 V) is applied between t4 and t5 (VBL=VSS), and pre-charge voltage V3 is applied at and after t6 (VBL=V3). The selected source line is grounded between t3 and t4 and between t5 and t6 (VSL=VSS), and to the selected source line, rewrite voltage V2 is applied between t4 and t5 (VSL=V2), and pre-charge voltage V3 is applied at and after t6 (VSL=V3). Ground voltage VSS (=0 V) is applied to a non-selected word line, and pre-charge voltage V3 is applied to a non-selected bit line and a non-selected source line.

In FIG. 5A, the selected bit line and the selected source line are grounded between t3 and t4 and between t5 and t6, and a write voltage is applied between t4 and t5. Hereinafter, a method for applying voltages having such pulse waveforms to memory cells is referred to as a post-grounding pulse method.

VSL-VBL denotes a pulse waveform obtained by subtracting selected bit-line voltage VBL from selected source-line voltage VSL. The memory cell is set to LR when the value of VSL-VBL is a positive value, and is set to HR when the value of VSL-VBL is a negative value. Here, an example of setting the memory cell to LR is shown, and VSL-VBL indicates a positive value. On the other hand, when the memory cell is set to HR, rewrite voltage V1 is applied to a selected bit line, and rewrite voltage VSS (=0 V) is applied to a selected source line. In this case, VSL-VBL indicates a negative value.

FIGS. 5B to 5E each illustrates a timing chart in the case where voltage application timings have deviated due to wiring delay etc. similarly to the cases in FIGS. 16B to 16E. As illustrated in FIGS. 5B to 5E, even when voltage application timings have deviated due to wiring delay etc., it is possible to reduce variation in the widths of the application pulses having 0 V or above as a voltage of VSL-VBL.

It is to be noted that the post-grounding pulse method produces periods in each of which the value of VSL-VBL is a negative value. The periods in which the value of VSL-VBL is a negative value are the t5-t6 section in FIG. 5B, the t3-t4 section in FIG. 5C, the t2-t3 section in FIG. 5D, and the t6-t7 section in FIG. 5E. In each of these sections, an operation for setting memory cells to HR using pre-charge voltage V3 may be performed in response to the operation for setting the memory cells to LR. This can be addressed by, for example, setting in advance pre-charge voltage V3 to a voltage which does not set the memory cells to HR.

In the method for rewriting semiconductor storage device 2 and semiconductor storage device 2 according to this embodiment, pre-charge voltage V3 is applied to bit lines and source lines when semiconductor storage device 2 is rewritten. This makes it possible to apply a high voltage to the memory cell (for example, a MOS transistor). Furthermore, according to the post-grounding pulse method considering differences in voltage application timing due to wiring delay etc., it is possible to reduce occurrence of a plurality of unstable-waveform application pulses and variation in the widths of the application pulses.

Embodiment 3

Hereinafter, Embodiment 3 is described with reference to FIG. 6.

The configuration of semiconductor storage device 3 according to this embodiment is the same as that of semiconductor storage device 1, and thus descriptions thereof are not repeated.

Figure 6:
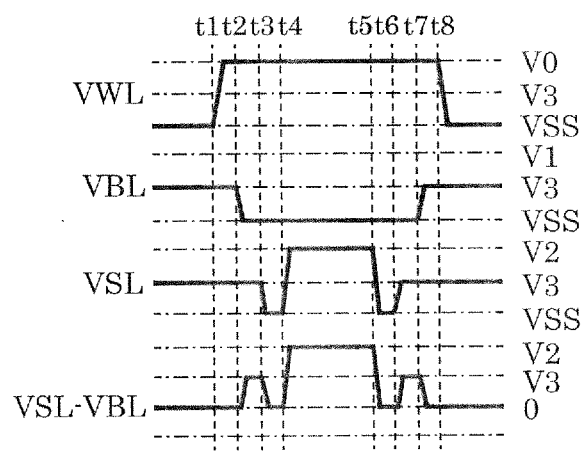
FIG. 6 is a timing chart of rewriting a semiconductor storage device according to Embodiment 3.

FIG. 6 is a timing chart of rewriting semiconductor storage device 3 according to Embodiment 3.

FIG. 6 indicates a bias state at the time when a selected memory cell is set to LR.

Here, at least one word line is selected from among the plurality of word lines as a selected word line. In addition, at least one bit line is selected from among the plurality of bit lines as a selected bit line, and at least one source line is selected from among the plurality of source lines as a selected source line.

First, pre-charge voltage V3 is applied to both of the plurality of bit lines and the plurality of source lines (a first rewriting step). Next, both of the selected bit line and the selected source line are grounded (a second rewriting step). Next, both of the selected bit line and the selected source line are grounded (a third rewriting step). Next, rewrite voltage (VSS (=0 V), V1 or V2) is applied to both of the selected bit line and the selected source line (a fourth rewriting step). Next, both of the selected bit line and the selected source line are grounded (a fifth rewriting step). Subsequently, pre-charge voltage V3 is applied to one of the selected bit line or the selected source line (a sixth rewriting step). Lastly, pre-charge voltage V3 is applied to both of the selected bit line and the selected source line (a seventh rewriting step). It is to be noted that the first to seventh rewriting steps may be performed in sequence. In other words, it is not always necessary to perform different operations between steps.

Specific operations performed in the first to seventh rewriting steps are described below.

As illustrated in FIG. 6, first, pre-charge voltage V3 is applied to a selected bit line and a selected source line (VBL=V3, VSL=V3). Rewrite voltage V0 is applied to a selected word line between t1 and t8 (VWL=V0). The selected bit line is grounded between t2 and t4 and between t5 and t7 (VBL=VSS), and to the selected bit line, rewrite voltage VSS (=0 V) is applied between t4 and t5 (VBL=VSS), and pre-charge voltage V3 is applied at and after t7 (VBL=V3). The selected source line is grounded between t3 and t4 and between t5 and t6 (VSL=VSS), and to the selected source line, rewrite voltage V2 is applied between t4 and t5 (VSL=V2), and pre-charge voltage V3 is applied at and after t6 (VSL=V3). In addition, ground voltage VSS (=0 V) is applied to a non-selected word line, and pre-charge voltage V3 is applied to a non-selected bit line and a non-selected source line.

In FIG. 6, the pulse waveform of the selected bit-line voltage VBL covers the pulse waveform of the selected source-line voltage VSL (which is the same as the pulse waveform of the selected source-line voltage VSL in the post-grounding pulse method). Hereinafter, a method for applying voltages having such pulse waveforms to memory cells is referred to as a post-grounding cover pulse method.

VSL-VBL denotes a pulse waveform obtained by subtracting selected bit-line voltage VBL from selected source-line voltage VSL. The memory cell is set to LR when the value of VSL-VBL is a positive value, and is set to HR when the value of VSL-VBL is a negative value. Here, an example of setting the memory cell to LR is shown, and VSL-VBL indicates a positive value. On the other hand, when the memory cell is set to HR, rewrite voltage V1 is applied to a selected bit line, and rewrite voltage VSS (=0 V) is applied to a selected source line. In this case, VSL-VBL indicates a negative value.

The post-grounding cover pulse method does not produce periods in each of which the value of VSL-VBL is a negative value although such periods are seen in the case of the post-grounding pulse method. Accordingly, in the post-grounding cover pulse method, it is unnecessary to limit pre-charge voltage V3 as required in the case of post-grounding pulse method. In addition, the post-grounding cover pulse method makes it possible to reduce variation in the widths of the application pulses effectively as in the post-grounding pulse method even when voltage application timings have deviated due to wiring delay etc.

In the method for rewriting semiconductor storage device 3 and semiconductor storage device 3 according to this embodiment, pre-charge voltage V3 is applied to bit lines and source lines when semiconductor storage device 3 is rewritten. This makes it possible to apply a high voltage to the memory cell (for example, a MOS transistor). Furthermore, according to the post-grounding cover pulse method considering differences in voltage application timing due to wiring delay etc., it is possible to reduce occurrence of a plurality of unstable-waveform application pulses and variation in the widths of the application pulses, without limiting pre-charge voltage V3 as in the post-grounding pulse method.

Embodiment 4

Hereinafter, Embodiment 4 is described with reference to FIG. 7A to FIG. 9B.

Figure 7A:
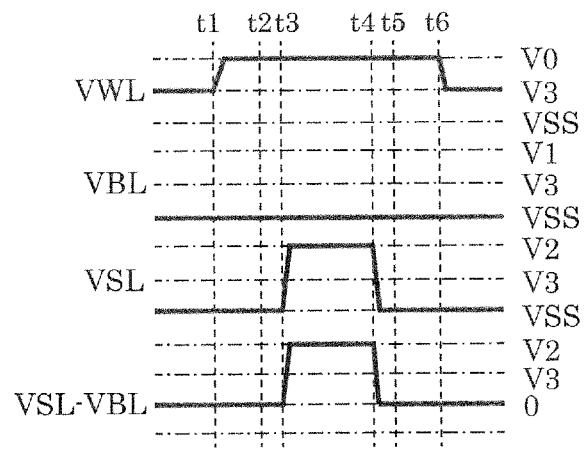
FIG. 7A is a timing chart of rewriting a semiconductor storage device according to Embodiment 4.
Figure 7B:
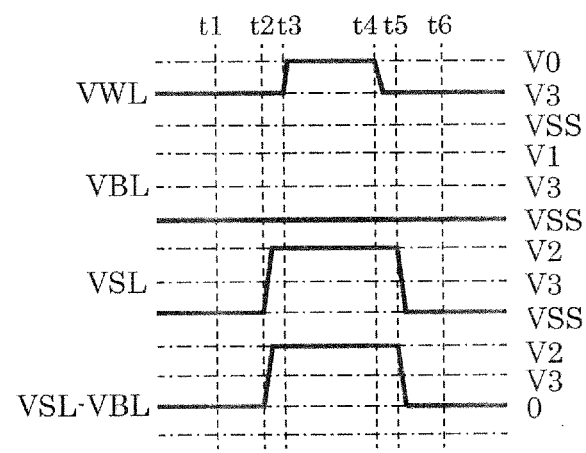
FIG. 7B is a timing chart of rewriting the semiconductor storage device according to Embodiment 4.
Figure 7C:
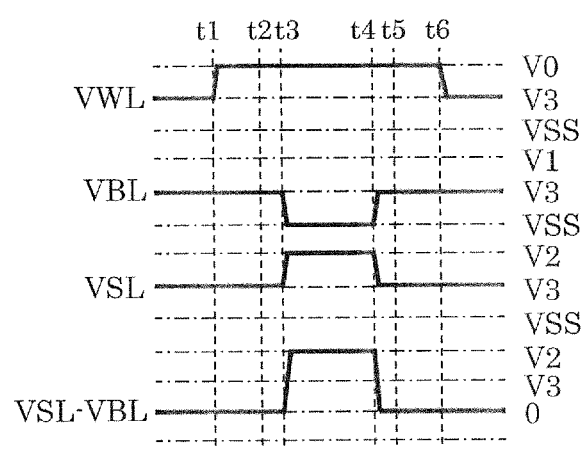
FIG. 7C is a timing chart of rewriting the semiconductor storage device according to Embodiment 4.
Figure 7D:
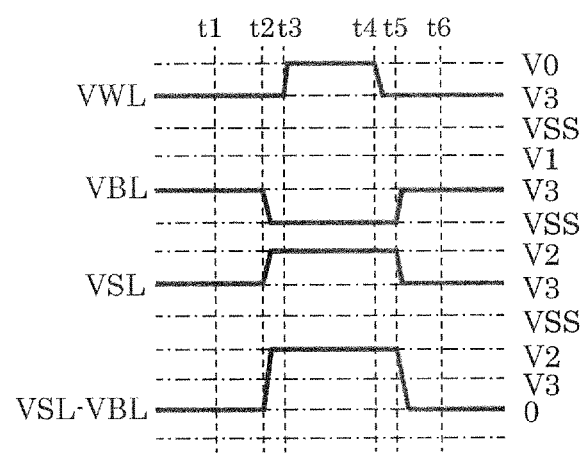
FIG. 7D is a timing chart of rewriting the semiconductor storage device according to Embodiment 4.

FIGS. 7A and 7D are each a timing chart of rewriting semiconductor storage device 4 according to Embodiment 4.

FIGS. 7A and 7D are each indicates a bias state at the time when a selected memory cell is set to LR.

Here, at least one word line is selected from among the plurality of word lines as a selected word line. In addition, at least one bit line is selected from among the plurality of bit lines as a selected bit line, and at least one source line is selected from among the plurality of source lines as a selected source line.

First, pre-charge voltage V3 is applied to a selected word line (a first rewriting step). Next, rewrite voltage V0 is applied to the selected word line (a second rewriting step). Lastly, pre-charge voltage V3 is applied to the selected word line (a third rewriting step). It is to be noted that the first to third rewriting steps may be performed in sequence. In other words, it is not always necessary to perform different operations between steps.

Specific operations performed in the first to third rewriting steps are described below.

As illustrated in FIG. 7A, first, pre-charge voltage V3 is applied to the selected word line (VWL=V3). Rewrite voltage V0 is applied to the selected word line between t1 and t6 (VWL=V0). To a selected bit line, rewrite voltage VSS (=0 V) is applied between t3 and t4 (VBL=VSS). To a selected source line, rewrite voltage V2 is applied between t3 and t4 (VSL=V2). Ground voltage VSS (=0 V) is applied to a non-selected word line, a non-selected bit line, and a non-selected source line.

VSL-VBL denotes a pulse waveform obtained by subtracting selected bit-line voltage VBL from selected source-line voltage VSL. The memory cell is set to LR when the value of VSL-VBL is a positive value, and is set to HR when the value of VSL-VBL is a negative value. Here, an example of setting the memory cell to LR is shown, and VSL-VBL indicates a positive value. On the other hand, when the memory cell is set to HR, rewrite voltage V1 is applied to a selected bit line, and rewrite voltage VSS (=0 V) is applied to a selected source line. In this case, VSL-VBL is a negative value.

Each of Embodiments 1 to 3 makes it possible to apply a high voltage to memory cells (for example, MOS transistors) by applying pre-charge voltage V3 to the bit lines and the source lines. This embodiment, however, makes it possible to apply a high voltage to memory cells (for example, MOS transistors) by applying pre-charge voltage V3 to the word lines.

In FIG. 7A, writing time (t4-t3) is controlled by controlling the selected bit line and the selected source line, and in FIG. 7B, writing time (t4-t3) is controlled by controlling the selected word line. More specifically, the following operations are performed.

As illustrated in FIG. 7B, first, pre-charge voltage V3 is applied to the selected word line (VWL=V3). Rewrite voltage V0 is applied to the selected word line between t3 and t4 (VWL=V0). To a selected bit line, rewrite voltage VSS (=0 V) is applied between t2 and t5 (VBL=VSS). To a selected source line, rewrite voltage V2 is applied between t2 and t5 (VSL=V2). Ground voltage VSS (=0 V) is applied to a non-selected word line, a non-selected bit line, and a non-selected source line.

FIG. 7C illustrates an additional function for pre-charging the selected bit line and the selected source line, in addition to the functions in FIG. 7A.

In FIG. 7C, writing time (t4-t3) is controlled by controlling the selected bit line and the selected source line, and in FIG. 7D, writing time (t4-t3) is controlled by controlling the selected word line. In this way, it is possible to apply a high voltage to memory cells.

Next, a configuration of semiconductor storage device 4 according to Embodiment 4 is described.

Figure 8:
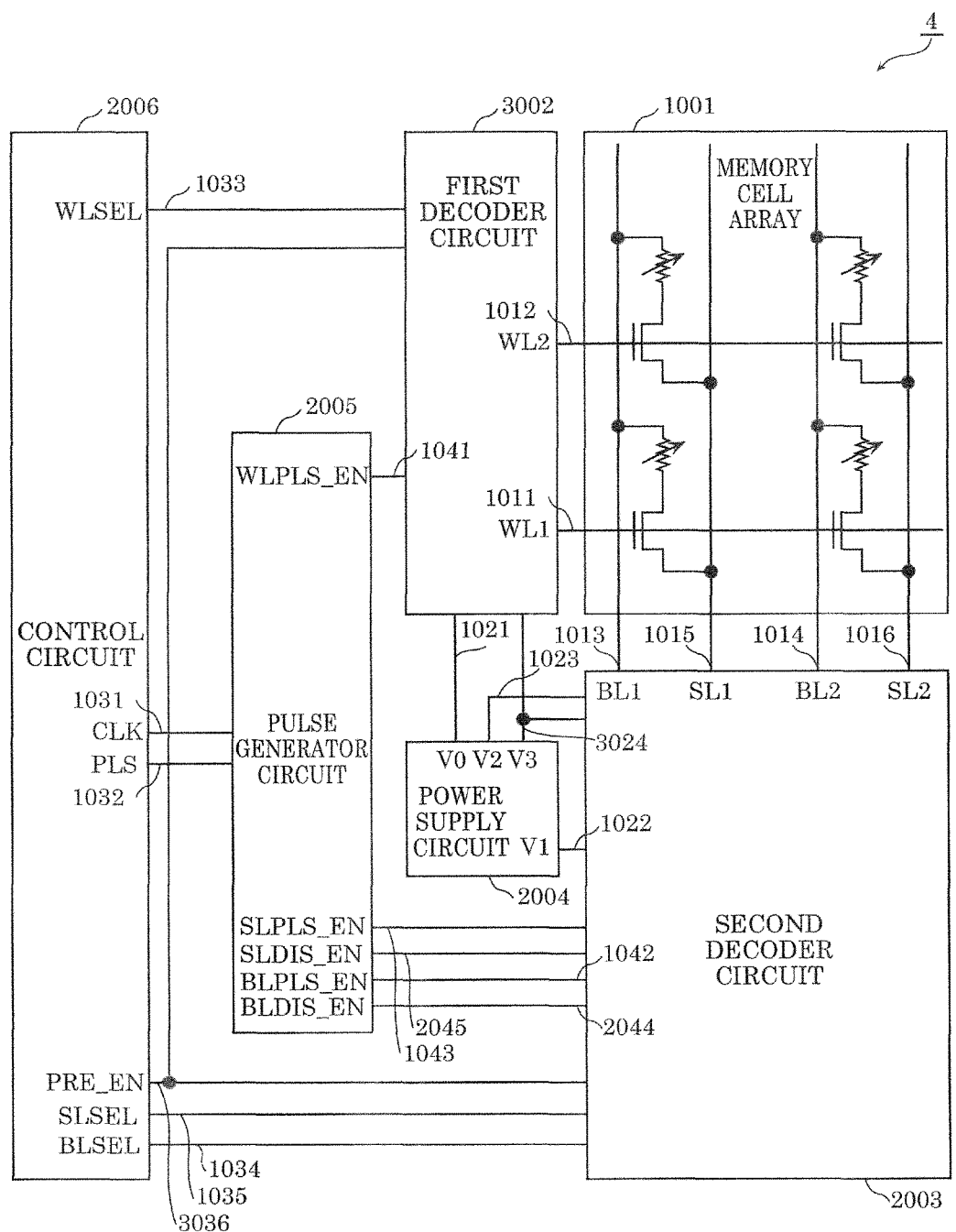
FIG. 8 is a circuit configuration diagram of the semiconductor storage device according to Embodiment 4.

FIG. 8 is a circuit configuration diagram of semiconductor storage device 4 according to Embodiment 4.

Here, differences from the circuit configuration of conventional semiconductor storage device 10 illustrated in FIG. 2 are described. Semiconductor storage device 4 according to this embodiment includes first decoder circuit 3002 instead of first decoder circuit 1002. Semiconductor storage device 4 further includes power supply line 3024 instead of power supply line 2024, and pre-charge enable signal line 3036 instead of pre-charge enable signal line 2036. These points are differences between semiconductor storage device 4 and semiconductor storage device 1 according to Embodiment 1. Since the other constituent elements of semiconductor storage device 4 are the same as those of semiconductor storage device 1 according to Embodiment 1, descriptions thereof are not repeated.

First decoder circuit 3002 has the same function as the function of first decoder circuit 1002, and power supply line 3024 is connected to first decoder circuit 3002.

Power supply line 3024 is a power supply line which transmits pre-charge voltage V3 generated by power supply circuit 2004, and is connected from power supply circuit 2004 to first decoder circuit 3002 and second decoder circuit 2003. In this way, pre-charge voltage V3 is applied to both of first decoder circuit 3002 and second decoder circuit 2003.

Pre-charge enable signal line 3036 is a signal line which transmits pre-charge enable signal PRE_EN generated by control circuit 2006, and is connected from control circuit 2006 to first decoder circuit 3002 and second decoder circuit 2003. In this way, pre-charge enable signal PRE_EN is input to both of first decoder circuit 3002 and second decoder circuit 2003.

Next, descriptions are given of a configuration of first decoder circuit 3002 and a timing chart indicating a timing at which memory cells were rewritten.

Figure 9A:
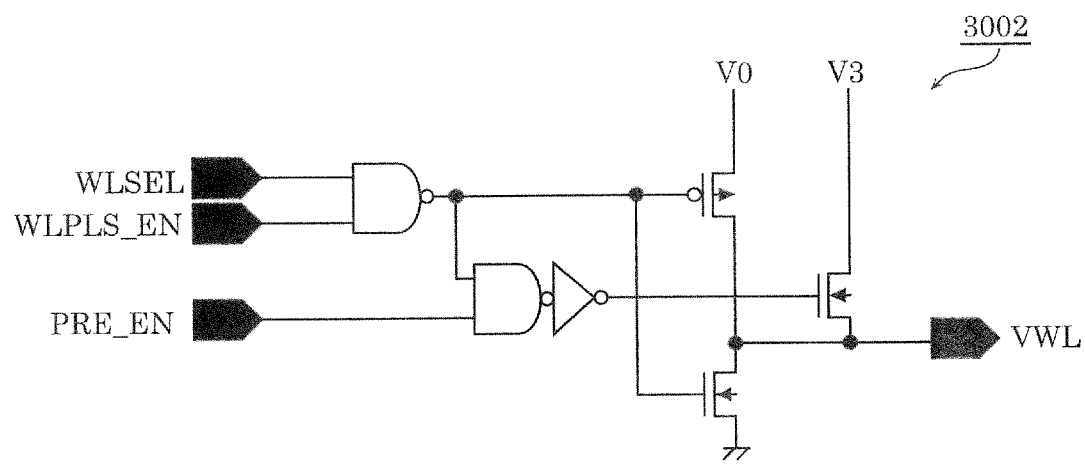
FIG. 9A is a circuit diagram of a first decoder circuit of the semiconductor storage device according to Embodiment 4.
Figure 9B:
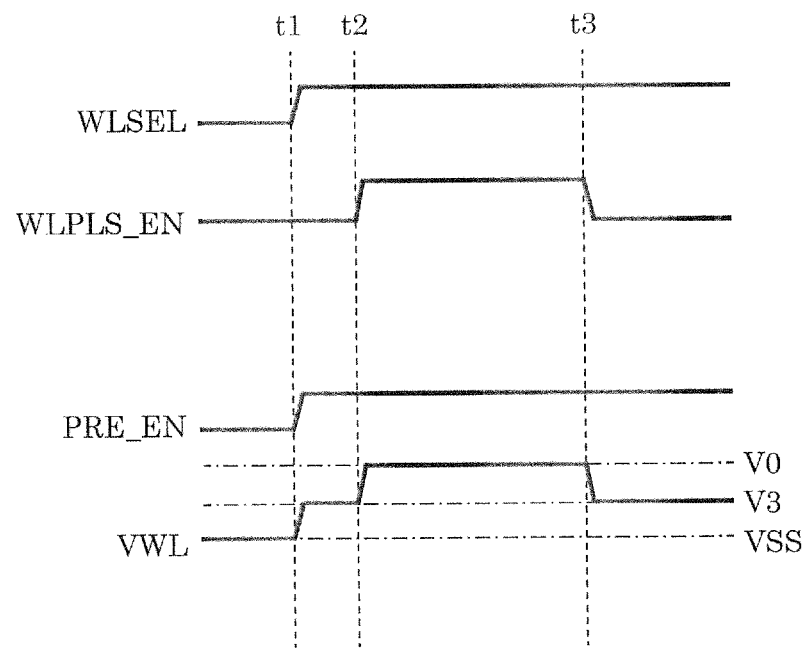
FIG. 9B is a timing chart for the first decoder circuit of the semiconductor storage device according to Embodiment 4.

FIG. 9A is a circuit diagram of first decoder circuit 3002 of semiconductor storage device 4 according to Embodiment 4. FIG. 9B is a timing chart of rewriting by first decoder circuit 3002 of semiconductor storage device 4 according to Embodiment 4.

FIG. 9A illustrates an example of first decoder circuit 3002. As illustrated in FIG. 9A, first decoder circuit 3002 receives inputs of word-line selection signal WLSEL, word-line pulse enable signal WLPLS_EN, and pre-charge enable signal PRE_EN. In addition, first decoder circuit 3002 outputs bit-line voltage VBL. When both of word-line selection signal WLSEL and word-line pulse enable signal WLPLS_EN are "H", rewrite voltage V0 is output as word-line voltage VWL. When pre-charge enable signal PRE_EN is "H" and word-line selection signal WLSEL and word-line pulse enable signal WLPLS_EN are not "H", pre-charge voltage V3 is output as word-line voltage VWL.

FIG. 9B illustrates a timing chart of rewriting by first decoder circuit 3002. At t1, word-line selection signal WLSEL and pre-charge enable signal PRE_EN change from "L" to "H". Word-line pulse enable signal WLPLS_EN is "L", and thus pre-charge voltage V3 is output as word-line voltage VWL. At t2, word-line pulse enable signal WLPLS_EN changes from "L" to "H", and rewrite voltage V0 is output as word-line voltage VWL. At t3, word-line pulse enable signal WLPLS_EN changes from "H" to "L", and pre-charge voltage V3 is output as word-line voltage VWL.

As described above, in the method for rewriting semiconductor storage device 4 and semiconductor storage device 4 according to this embodiment, pre-charge voltage V3 is applied to word lines when semiconductor storage device 4 is rewritten. This makes it possible to apply a high voltage to the memory cell (for example, a MOS transistor).

Embodiment 5

Hereinafter, Embodiment 5 is described with reference to FIGS. 10 and 11.

Figure 10:
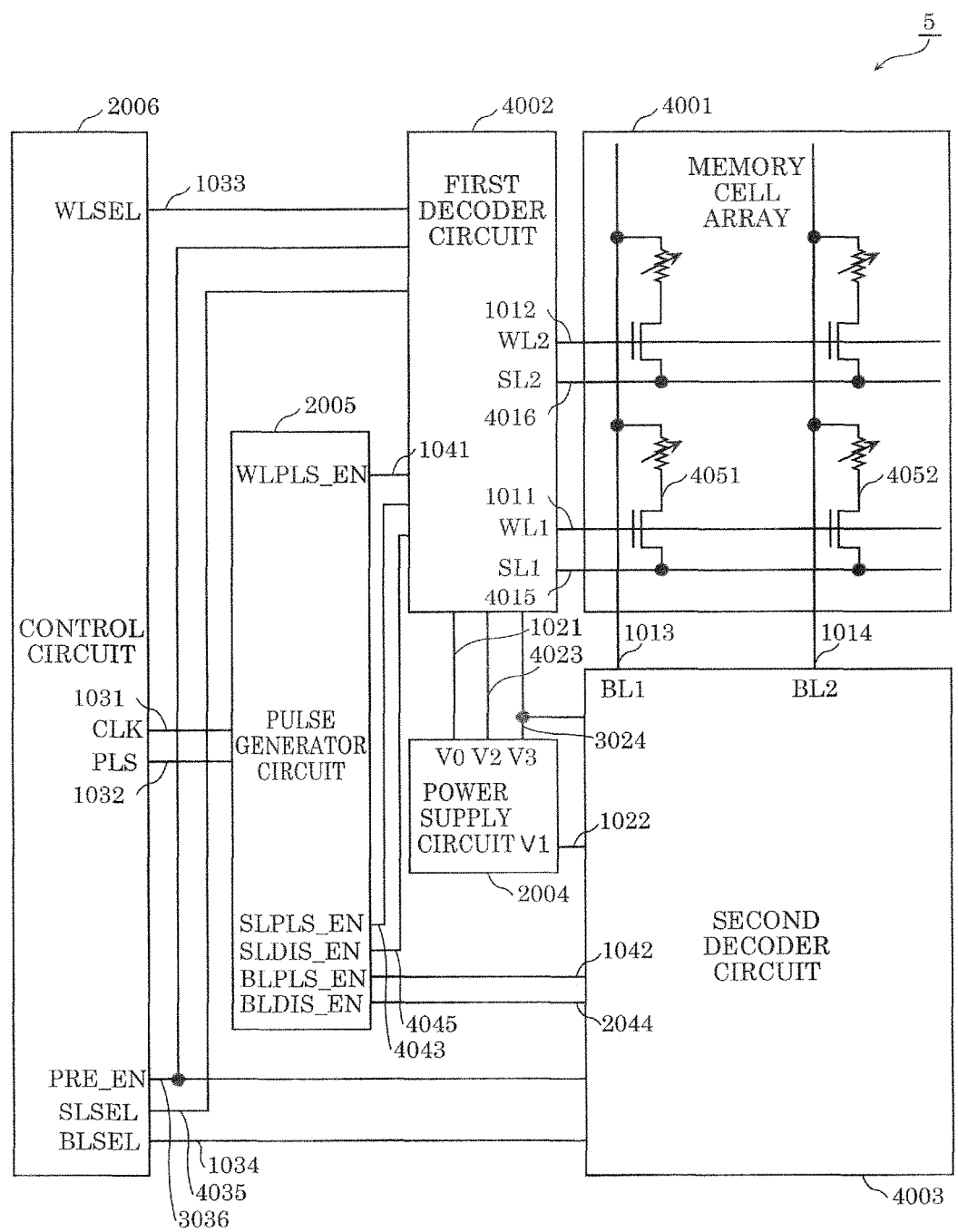
FIG. 10 is a circuit configuration diagram of the semiconductor storage device according to Embodiment 5.

FIG. 10 is a circuit configuration diagram of semiconductor storage device 5 according to Embodiment 5.

Here, descriptions are given of differences from the circuit configuration of semiconductor storage device 4 according to Embodiment 4 and illustrated in FIG. 8. Semiconductor storage device 5 according to this embodiment includes memory cell array 4001 instead of memory cell array 1001, first decoder circuit 4002 instead of first decoder circuit 3002, and second decoder circuit 4003 instead of second decoder circuit 2003. Semiconductor storage device 5 further includes source lines 4015 and 4016 instead of source lines 1015 and 1016, and power supply line 4023 instead of power supply line 1023. Semiconductor storage device 5 further includes source-line selection signal line 4035 instead of source-line selection signal line 1035, source-line pulse enable signal line 4043 instead of source-line pulse enable signal line 1043, and source-line discharge enable signal line 4045 instead of source-line discharge enable signal line 2045. These points are differences between semiconductor storage device 5 and semiconductor storage device 4 according to Embodiment 4. Since the other constituent elements of semiconductor storage device 5 are the same as those of semiconductor storage device 4 according to Embodiment 4, descriptions thereof are not repeated.

First decoder circuit 4002 selects, as a selected word line, at least one word line from among the plurality of word lines, and selects, as a selected source line, at least one source line from among the plurality of source lines. In addition, first decoder circuit 4002 includes the same function as the function of first decoder circuit 3002. To first decoder circuit 4002, the following is connected: power supply line 4023, source-line selection signal line 4035, source-line pulse enable signal line 4043, and source-line discharge enable signal line 4045.

Second decoder circuit 4003 selects, as a selected bit line, at least one bit line from among the plurality of bit lines. In addition, second decoder circuit 4003 does not include source lines 1015 and 1016, power supply line 1023, source-line selection signal line 1035, source-line pulse enable signal line 1043, and source-line discharge enable signal line 2045 which are connected to second decoder circuit 2003.

The plurality of source lines (4015 and 4016) are source lines of memory cell array 4001, arranged to extend in a first direction, and connected to first decoder circuit 4002. Memory cell array 4001 receives application of source-line voltages SL1 and SL2 via source lines 4015 and 4016.

Power supply line 4023 is a power supply line which transmits rewrite voltage V2 generated by power supply circuit 2004, and is connected from power supply circuit 2004 to first decoder circuit 4002.

Source-line selection signal line 4035 is a signal line which transmits source-line selection signal SLSEL generated by control circuit 2006, and is connected from control circuit 2006 to first decoder circuit 4002. In this way, source-line selection signal SLSEL is input to first decoder circuit 4002.

Source-line pulse enable signal line 4043 is a signal line which transmits source-line pulse enable signal SLPLS_EN generated by pulse generator circuit 2005, and is connected from pulse generator circuit 2005 to first decoder circuit 4002. In this way, source-line pulse enable signal SLPLS_EN is input to first decoder circuit 4002.

Source-line discharge enable signal line 4045 is a signal line which transmits source-line discharge enable signal SLDIS_EN generated by pulse generator circuit 2005, and is connected from pulse generator circuit 2005 to first decoder circuit 4002. In this way, source-line discharge enable signal SLDIS_EN is input to first decoder circuit 4002.

In memory cell array 4001, the plurality of word lines (1011 and 1012) and the plurality of source lines (4015 and 4016) are provided to extend in the first direction, and the plurality of bit lines (1013 and 1014) are provided to extend in a second direction different from the first direction. More specifically, although bit lines 1013 and 1014 are parallel to source lines 1015 and 1016 in memory cell array 1001 in each of Embodiments 1 to 4, word lines 1011 and 1012 are parallel to source lines 4015 and 4016 in memory cell array 4001 in Embodiment 5. It is to be noted that when a semiconductor storage device based on semiconductor storage device 5 according to this embodiment is used to perform operations similar to the operations performed in Embodiments 1 to 4, effects similar to the effects obtained in Embodiments 1 to 4 can be achieved. For example, FIG. 11 illustrates an example of rewriting according to a cover pulse method in which bit lines and source lines are pre-charged, as in the case of Embodiment 1.

Figure 11:
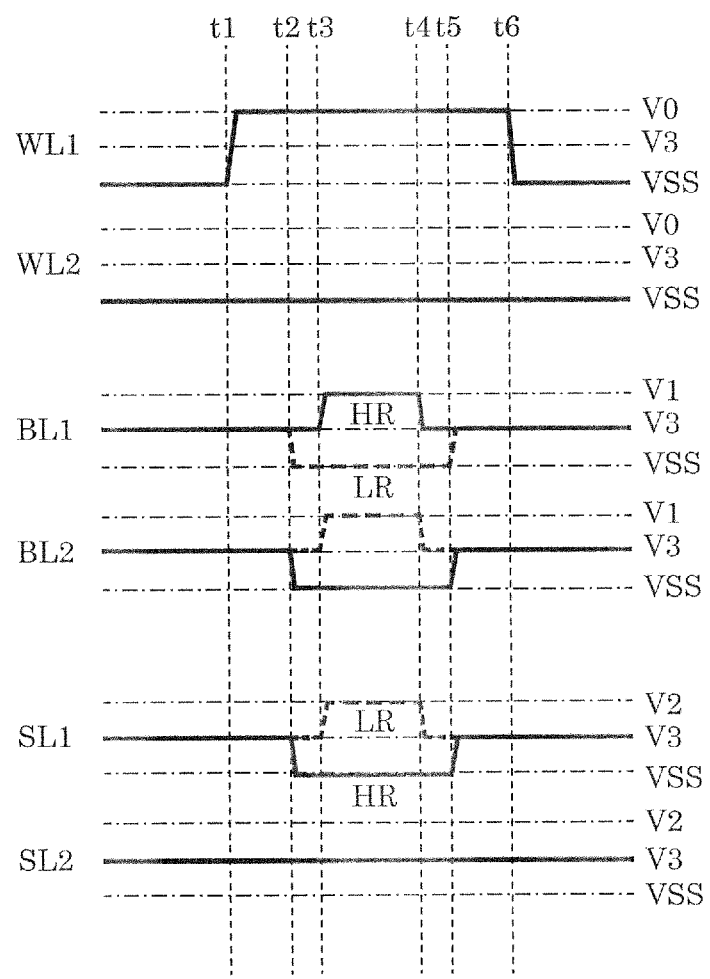
FIG. 11 is a timing chart of rewriting a semiconductor storage device according to Embodiment 5.

FIG. 11 is a timing chart of rewriting semiconductor storage device 5 according to Embodiment 5.

FIG. 11 is a timing chart for word lines 1011 and 1012, bit lines 1013 and 1014, and source lines 4015 and 4016 illustrated in FIG. 10. As illustrated in FIG. 11, by means of one of the pulse waveform of a selected source-line voltage and the pulse waveform of a selected bit-line voltage covering the other, it is possible to reduce occurrence of a plurality of unstable-waveform application pulses which occur in the case of the simultaneous pulse method, and to thereby reduce variation in the widths of the application pulses. In addition, FIG. 11 illustrates pulse waveforms at the time when memory cell 4051 illustrated in FIG. 10 is selected, word line 1011 is selected as a selected word line, source line 4015 is selected as a selected source line, and bit line 1013 is selected as a selected bit line. Although memory cell 4052 is a non-selected memory cell, since it is disposed above word line 1011 and source line 4015 shared by memory cells 4051 and 4052, the voltage which is applied to selected memory cell 4051 is applied thereto. Accordingly, there is a need to apply a voltage equal to the voltage applied to the selected source line to a non-selected bit line which is a bit line other than the selected bit line among the plurality of bit lines, at a same timing as a timing at which the voltage is applied to the selected source line. More specifically, there is a need to apply the same voltage which is applied to selected source line 4015 to non-selected bit line 1014 at a same timing as a timing at which the voltage is applied to selected source line 4015 so that non-selected memory cell 4052 is not rewritten. As illustrated in FIG. 11, non-selected bit-line voltage BL2 has the same waveform as the waveform of selected source-line voltage SL1 at the same timing. This holds true for when a semiconductor storage device based on semiconductor storage device 5 according to this embodiment is used to perform operations similar to the operations performed in Embodiments 2 to 4.

As described above, in the method for rewriting semiconductor storage device 5 and semiconductor storage device 5 according to this embodiment, a pre-charge voltage is applied to bit lines and source lines or to word lines when semiconductor storage device 5 is rewritten. This makes it possible to apply a high voltage to the memory cell (for example, a MOS transistor). Furthermore, according to the pulse application method considering voltage application timing deviation due to wiring delay etc. (the cover pulse method, the post-grounding pulse method, or the post-grounding cover pulse method), it is possible to reduce occurrence of unstable-waveform application pulses and variation in the widths of the application pulses.

Other Embodiments

Although methods for rewriting semiconductor storage devices and the semiconductor storage devices according to the present disclosure have been described above based on the above non-limiting embodiments, the present disclosure is not limited to the above embodiments.

The present disclosure covers and encompasses embodiments that a person skilled in the art may arrive at by adding various kinds of modifications to the above embodiments or by arbitrarily combining some of the constituent elements in the embodiments within the scope of the present disclosure.

INDUSTRIAL APPLICABILITY

The present disclosure is applicable to semiconductor storage devices, and particularly to memories for electronic devices, such as IC cards, for which high reliability in rewriting is required.

What is claimed is:

1. A semiconductor storage device, comprising:
a memory cell array;

a plurality of word lines arranged to extend in a first direction;

a plurality of bit lines arranged to extend in a second direction different from the first direction;

a plurality of source lines arranged to extend in the second direction;

a first decoder circuit which selects at least one word line from among the plurality of word lines as a selected word line;

a second decoder circuit which selects at least one bit line from among the plurality of bit lines as a selected bit line, and selects at least one source line from among the plurality of source lines as a selected source line;

a power supply circuit which generates at least two voltages which are a rewrite voltage and a pre-charge voltage;

a control circuit which generates: a clock signal and a pulse signal for applying the rewrite voltage to the memory cell array; a word line selection signal for selecting the selected word line; a bit line selection signal for selecting the selected bit line; a source line selection signal for selecting the selected source line; and a pre-charge enable signal for applying the pre-charge voltage to the plurality of bit lines and the plurality of source lines; and a pulse generator circuit which generates: a word-line pulse enable signal for controlling application of a pulse to the selected word line; a bit-line pulse enable signal and a bit-line discharge enable signal for controlling application of a pulse to the selected bit line; and a source-line pulse enable signal and a source-line discharge enable signal for controlling application of a pulse to the selected source line, wherein the memory cell array includes a plurality of memory cells, the plurality of memory cells each include a control element and a storage element, the control element and the storage element are connected to each other, the control element is connected to a word line included in the plurality of word lines, and to a source line included in the plurality of source lines, the storage element is connected to a bit line included in the plurality of bit lines, the plurality of word lines are connected to the first decoder circuit, the plurality of bit lines and the plurality of source lines are connected to the second decoder circuit, the word-line selection signal is input to the first decoder circuit, the bit-line selection signal, the source-line selection signal, and the pre-charge enable signal are input to the second decoder circuit, the clock signal and the pulse signal are input to the pulse generator circuit, the word-line pulse enable signal is input to the first decoder circuit, the bit-line pulse enable signal, the bit-line discharge enable signal, the source-line pulse enable signal, and the source-line discharge enable signal are input to the second decoder circuit, and the rewrite voltage and the pre-charge voltage are applied to the first decoder circuit or the second decoder circuit.

2. The semiconductor storage device according to claim 1, wherein the pre-charge enable signal is input to both of the first decoder circuit and the second decoder circuit, and the pre-charge voltage is applied to both of the first decoder circuit and the second decoder circuit.

3. The semiconductor storage device according to claim 1, wherein the pre-charge voltage is an intermediate voltage between the rewrite voltage and 0 V.

4. The semiconductor storage device according to claim 1, wherein the control element is a diode or a transistor.

5. The semiconductor storage device according to claim 1, wherein the storage element is a capacitor, a charge storage element, a variable resistance element, a ferroelectric element, a magnetoresistive element, or a phase-change element.

* * * * *